(12) United States Patent
Jeong et al.

(10) Patent No.: US 9,748,108 B2
(45) Date of Patent: Aug. 29, 2017

(54) METHOD OF FORMING GRAPHENE NANOPATTERN BY USING MASK FORMED FROM BLOCK COPOLYMER

(71) Applicant: Samsung Electronics Co., Ltd., Suwon-si, Gyeonggi-do (KR)

(72) Inventors: Seongjun Jeong, Hwaseong-si (KR); Seongjun Park, Seoul (KR); Yunseong Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/068,110

(22) Filed: Mar. 11, 2016

(65) Prior Publication Data

US 2017/0011930 A1 Jan. 12, 2017

(30) Foreign Application Priority Data

Jul. 7, 2015 (KR) .......................... 10-2015-0096788

(51) Int. Cl.
*H01L 21/308* (2006.01)
*H01L 21/467* (2006.01)
(Continued)

(52) U.S. Cl.
CPC ...... *H01L 21/3088* (2013.01); *H01L 21/3065* (2013.01); *H01L 21/3081* (2013.01);
(Continued)

(58) Field of Classification Search
CPC ............. H01L 21/0271; H01L 21/3065; H01L 21/3081; H01L 21/3085; H01L 21/3086;
(Continued)

(56) References Cited

U.S. PATENT DOCUMENTS 8,703,090 B2 4/2014 Tour et al.
8,968,587 B2 3/2015 Shin et al.
(Continued)

FOREIGN PATENT DOCUMENTS

JP 2013006742 A 1/2013
KR 20110133452 A 12/2011
WO WO-2011/094204 A2 8/2011

OTHER PUBLICATIONS

Guanxiong Liu, et al. "Epitaxial Graphene Nanoribbon Array Fabrication Using BCP-Assisted Nanolithography" ACS Nano, pp. 6786-6792 (2012).
(Continued)

*Primary Examiner* — Stephen W Smoot
(74) *Attorney, Agent, or Firm* — Harness, Dickey & Pierce, P.L.C.

(57) ABSTRACT

Methods of forming a graphene nanopattern, graphene-containing devices, and methods of manufacturing the graphene-containing devices are provided. A method of forming the graphene nanopattern may include forming a graphene layer on a substrate, forming a block copolymer layer on the graphene layer and a region of the substrate exposed on at least one side of the graphene layer, forming a mask pattern from the block copolymer layer by removing one of a plurality of first region and a plurality of second regions of the block copolymer, and patterning the graphene layer in a nanoscale by using the mask pattern as an etching mask. The block copolymer layer may be formed to directly contact the graphene layer. The block copolymer layer may be formed to directly contact a region of the substrate structure that is exposed on at least one side of the graphene layer.

27 Claims, 25 Drawing Sheets

(51) Int. Cl.
*H01L 51/00* (2006.01)
*H01L 29/66* (2006.01)
*H01L 29/778* (2006.01)
*H01L 29/06* (2006.01)
*H01L 29/16* (2006.01)
*H01L 21/3065* (2006.01)
*B82Y 10/00* (2011.01)
*B82Y 40/00* (2011.01)
*H01L 29/775* (2006.01)

(52) U.S. Cl.
CPC ...... *H01L 21/3085* (2013.01); *H01L 21/3086* (2013.01); *H01L 21/467* (2013.01); *H01L 29/0673* (2013.01); *H01L 29/0676* (2013.01); *H01L 29/1606* (2013.01); *H01L 29/66037* (2013.01); *H01L 29/66045* (2013.01); *H01L 29/778* (2013.01); *H01L 51/0045* (2013.01); *B82Y 10/00* (2013.01); *B82Y 40/00* (2013.01); *H01L 29/775* (2013.01); *Y10S 977/888* (2013.01)

(58) Field of Classification Search
CPC ............... H01L 21/3088; H01L 21/467; H01L 29/0665; H01L 29/1606; H01L 29/66015; H01L 29/66045; H01L 51/0017; H01L 51/0045; Y10S 977/755; Y10S 977/888
See application file for complete search history.

(56) References Cited

U.S. PATENT DOCUMENTS

| | | | | |
|---|---|---|---|---|
| 9,012,882 | B2* | 4/2015 | Duan | B82Y 30/00 257/77 |
| 9,140,917 | B2* | 9/2015 | Lee | G02F 1/155 |
| 2008/0299353 | A1 | 12/2008 | Stoykovich et al. | |
| 2010/0105834 | A1 | 4/2010 | Tour et al. | |
| 2010/0311613 | A1* | 12/2010 | Busnaina | B82Y 10/00 506/14 |
| 2011/0033677 | A1* | 2/2011 | Shin | B82Y 30/00 428/201 |
| 2011/0201201 | A1 | 8/2011 | Arnold et al. | |
| 2011/0300338 | A1 | 12/2011 | Shin et al. | |
| 2012/0325405 | A1 | 12/2012 | Arnold et al. | |
| 2013/0330523 | A1* | 12/2013 | Zhang | C01B 31/0213 428/195.1 |
| 2014/0141581 | A1* | 5/2014 | Sato | H01L 29/1606 438/197 |
| 2014/0273361 | A1 | 9/2014 | Arnold et al. | |
| 2014/0273476 | A1 | 9/2014 | Cheng et al. | |
| 2015/0187602 | A1* | 7/2015 | Kim | H01L 21/0337 428/195.1 |
| 2016/0033401 | A1* | 2/2016 | Farmer | G01N 21/553 356/445 |

OTHER PUBLICATIONS

Jeong Gon Son, et al. "Sub-10 nm Graphene Nanoribbon Array Field-Effect Transistors Fabricated by Block Copolymer Lithography" Advanced Material, vol. 25, pp. 4723-4728 (2013).
Jingwei Bai et al., Graphene nanomesh,: Nature Nanotechnoogy, vol. 5, pp. 190-194 (Mar. 2010).
Jeong, et al. "Directed self-assembly of block copolymers for next generation nanolithography," Materials Today, vol. 16, No. 12, pp. 468-476 (2013).
Cheng, et al. "Dense Self-Assembly on Sparse Chemical Patterns: Rectifying and Multiplying Lithographic Patterns Using Block Copolymers," Advanced Materials, vol. 20, No. 16, pp. 3155-3158 (2008).
Extended European Search Report dated Nov. 29, 2016 issued in corresponding European Patent Application No. 16169421.1.
Chuvilin, et al. "Self-assembly of a sulphur-terminated graphene nanoribbon within a single-walled carbon nanotube", Nature Materials, vol. 10, pp. 687-692, (2011).

* cited by examiner

< ANNEALING >

METHOD OF FORMING GRAPHENE NANOPATTERN BY USING MASK FORMED FROM BLOCK COPOLYMER

CROSS-REFERENCE TO RELATED APPLICATION

This application claims priority under 35 U.S.C. §119 to Korean Patent Application No. 10-2015-0096788, filed on Jul. 7, 2015, in the Korean Intellectual Property Office, the disclosure of which is incorporated herein in its entirety by reference.

BACKGROUND

1. Field

The present disclosure relates to methods of forming a graphene nanopattern, graphene-containing devices, and methods of manufacturing the graphene-containing devices.

2. Description of Related Art

Graphene, which is a hexagonal single layer structure composed of carbon atoms, may be structurally and chemically stable and may have exhibit excellent electrical and physical characteristics. For example, graphene may have a charge mobility (e.g., ~$2 \times 10^5$ $cm^2/Vs$) that is about 100 times or more faster than a charge mobility of silicon (Si), and may have a current density (e.g., about $10^8$ $A/cm^2$) that is about 100 times or more higher than a current density of copper (Cu). Graphene may be flexible and transparent. Therefore, graphene has drawn attention as a next-generation material.

Owing to the features of graphene, research into the application of graphene to various electronic devices has been conducted. However, it is not easy to handle graphene and to process (e.g., pattern) graphene into a desired size and a desired shape. For this reason, it may not be easy to realize high-performance electronic devices with graphene.

SUMMARY

Provided are methods of patterning a graphene layer in a nanoscale.

Provided are methods of easily and precisely patterning a graphene layer.

Provided are methods of manufacturing a graphene-containing device by using methods of patterning a graphene layer.

Provided are graphene nanopatterns that may be formed via the above methods, and graphene-containing devices including the graphene nanopatterns.

Additional aspects will be set forth in part in the description which follows and, in part, will be apparent from the description, or may be learned by practice of example embodiments.

According to example embodiments, a method of forming a graphene nanopattern includes providing a graphene layer on a substrate, the graphene layer having a smaller width than the substrate; forming a block copolymer layer on the graphene layer and a region of the substrate exposed on at least one side of the graphene layer, the block copolymer layer including a plurality of first regions and a plurality of second regions arranged parallel to the graphene layer, and one of the plurality of first regions being arranged along an edge portion of the graphene layer; forming a mask pattern from the block copolymer layer by removing one of the plurality of first regions and the plurality of second regions of the block copolymer layer; and patterning the graphene layer in a nanoscale by using the mask pattern as an etching mask.

In example embodiments, the forming the block copolymer layer may include forming the block copolymer layer to directly contact the graphene layer.

In example embodiments, the forming the block copolymer layer may include forming the block copolymer layer to directly contact a region of the substrate that is exposed on the at least one side of the graphene layer.

In example embodiments, the forming the block copolymer layer may including using a directed self-assembly (DSA) method assisted by the edge portion of the graphene layer without using a topological guide.

In example embodiments, the patterning the graphene layer may include forming a plurality of unit patterns. At least one of the plurality of unit patterns may have a width that is greater than 0 nm and less than or equal to 10 nm.

In example embodiments, the patterning the graphene layer may include forming a plurality of unit patterns. At least one of the plurality of unit patterns may have that is greater than 0 nm and less than or equal to 5 nm.

In example embodiments, the graphene nanopattern may include a graphene nanoribbon (GNR).

In example embodiments, the edge portion of the graphene layer may have a straight line shape, and the graphene nanopattern may include a straight line pattern.

In example embodiments, the edge portion of the graphene layer may have a curved line shape, and the graphene nanopattern may include a curved line pattern.

In example embodiments, the graphene layer may have a width of several tens of nm to several hundreds of nm.

In example embodiments, the providing the graphene layer may include forming a plurality of graphene layers on the substrate, and the forming the block copolymer layer may include forming the block copolymer layer on the plurality of graphene layers.

In example embodiments, the substrate may have a wafer scale.

In example embodiments, the substrate may include an insulation layer on a surface thereof, and the forming the graphene layer may include forming the graphene layer on the insulation layer.

In example embodiments, the insulation layer may include a hydrophilic material.

In example embodiments, the block copolymer layer may include one of, for example, PS-b-PDMS, PS-b-P4VP, PS-b-P2VP, PS-b-PEO, PS-b-PAA, PS-b-PB, PS-b-PI, PI-b-P4VP, PI-b-P2VP, PI-b-PEO, PI-b-PAA, PMMA-b-P4VP, PMMA-b-P2VP, PMMA-b-PEO, PMMA-b-PAA, PS-b-PMA, PS-b-PMMA, PI-b-PMA, PI-b-PMMA, PMMA-b-PMA, PS-b-PS-OH, and PI-b-PS-OH.

In example embodiments, the forming the block copolymer layer may include forming a thin film by coating a surface of the graphene layer and the region of the substrate with a solution including a block copolymer, and inducing a self-assembly of the block copolymer in the thin film by annealing the thin film.

According to example embodiments, a method of forming a graphene nanopattern includes providing a graphene layer on an underlayer; forming a block copolymer layer directly on the graphene layer, the block copolymer layer including a plurality of first regions and a plurality of second regions alternately arranged in a direction parallel to the graphene layer, and one of the plurality of first regions being arranged along an edge portion of the graphene layer; forming a mask pattern by removing one of the plurality of first regions and the plurality of second regions of the block copolymer layer; and patterning the graphene layer in a nanoscale by using the mask pattern as an etching mask.

In example embodiments, the forming the block copolymer layer may include forming the block copolymer layer to directly contact a region of the underlayer that is exposed on at least one side of the graphene layer.

In example embodiments, the forming block copolymer layer may include using a directed self-assembly (DSA) method assisted by the edge portion of the graphene layer without using a topological guide.

According to example embodiments, a method of manufacturing a graphene-containing device includes forming a graphene nanopattern by using the above-described method; and forming a device unit including the graphene nanopattern.

In example embodiments, the graphene-containing device may include one of a field effect transistor (FET), a tunneling device, a binary junction transistor (BJT), a barristor, a memory device, a solar cell, a photodetector, a sensor, and a light-emitting device.

In example embodiments, the graphene-containing device may be a transistor, and the graphene nanopattern may be a channel layer of the transistor.

According to example embodiments, a graphene-containing device includes a substrate; a first device region on a first region of a substrate, the first device region including a first graphene nanopattern; and a second device region on a second region of the substrate, the second device region including a second graphene nanopattern. The second graphene nanopattern is separated from the first graphene nanopattern by a dead zone distance that is greater than 0 nm and less than or equal to 15 nm.

In example embodiments, the dead zone distance may be greater than 0 nm and less than or equal to 10 nm.

In example embodiments, each of the first and second graphene nanopatterns may include a graphene nanoribbon (GNR).

In example embodiments, a unit pattern of each of the first and second graphene nanopatterns may have a width that is greater than 0 nm and less than or equal to 10 nm.

In example embodiments, at least one of the first and second device regions may include one of a field effect transistor (FET), a tunneling device, a binary junction transistor (BJT), a barristor, a memory device, a solar cell, a photodetector, a sensor, and a light-emitting device.

According to example embodiments, a method of forming a graphene nanopattern may include forming a block copolymer layer on a stack structure, forming a mask pattern, and patterning the graphene layer in a nanoscale by using the mask pattern as an etching mask. The stack structure includes a graphene layer on a substrate. The graphene layer has a width that is smaller than a width of the substrate such that the graphene layer exposes a region of the substrate along at least one side of the graphene layer. The block copolymer layer includes a plurality of first regions and a plurality of second regions alternately arranged on the graphene layer and the substrate. One of the plurality of first regions is arranged along an edge portion of the graphene layer. The mask pattern is formed by removing one of the plurality of first regions and the plurality of second regions of the block copolymer layer.

In example embodiments, the block copolymer may include a first polymer and a second polymer. The first polymer and the second polymer may be different materials compared to each other. The first polymer may be hydrophobic compared to the second polymer. The second polymer may be hydrophilic compared to the first polymer. The plurality of first regions may be formed from the first polymer. The plurality of second regions may be formed from the second polymer.

In example embodiments, the block copolymer layer may include one of, for example, PS-b-PDMS, PS-b-P4VP, PS-b-P2VP, PS-b-PEO, PS-b-PAA, PS-b-PB, PS-b-PI, PI-b-P4VP, PI-b-P2VP, PI-b-PEO, PI-b-PAA, PMMA-b-P4VP, PMMA-b-P2VP, PMMA-b-PEO, PMMA-b-PAA, PS-b-PMA, PS-b-PMMA, PI-b-PMA, PI-b-PMMA, PMMA-b-PMA, PS-b-PS-OH, and PI-b-PS-OH.

In example embodiments, the forming the block copolymer on the stack structure may include forming the block copolymer directly on the graphene layer. The patterning the graphene layer may include forming a plurality of unit patterns. At least one of the plurality of unit patterns may have a width that is greater than 0 nm and less than or equal to 10 nm.

In example embodiments, the forming the block copolymer layer may including using a directed self-assembly (DSA) method assisted by the edge portion of the graphene layer without using a topological guide.

BRIEF DESCRIPTION OF THE DRAWINGS

These and/or other aspects will become apparent and more readily appreciated from the following description of non-limiting embodiments, taken in conjunction with the accompanying drawings in which like reference characters refer to like parts throughout the different views. The drawings are not necessarily to scale, emphasis instead being placed upon illustrating principles of inventive concepts. In the drawings.

DETAILED DESCRIPTION

Figure 1A:
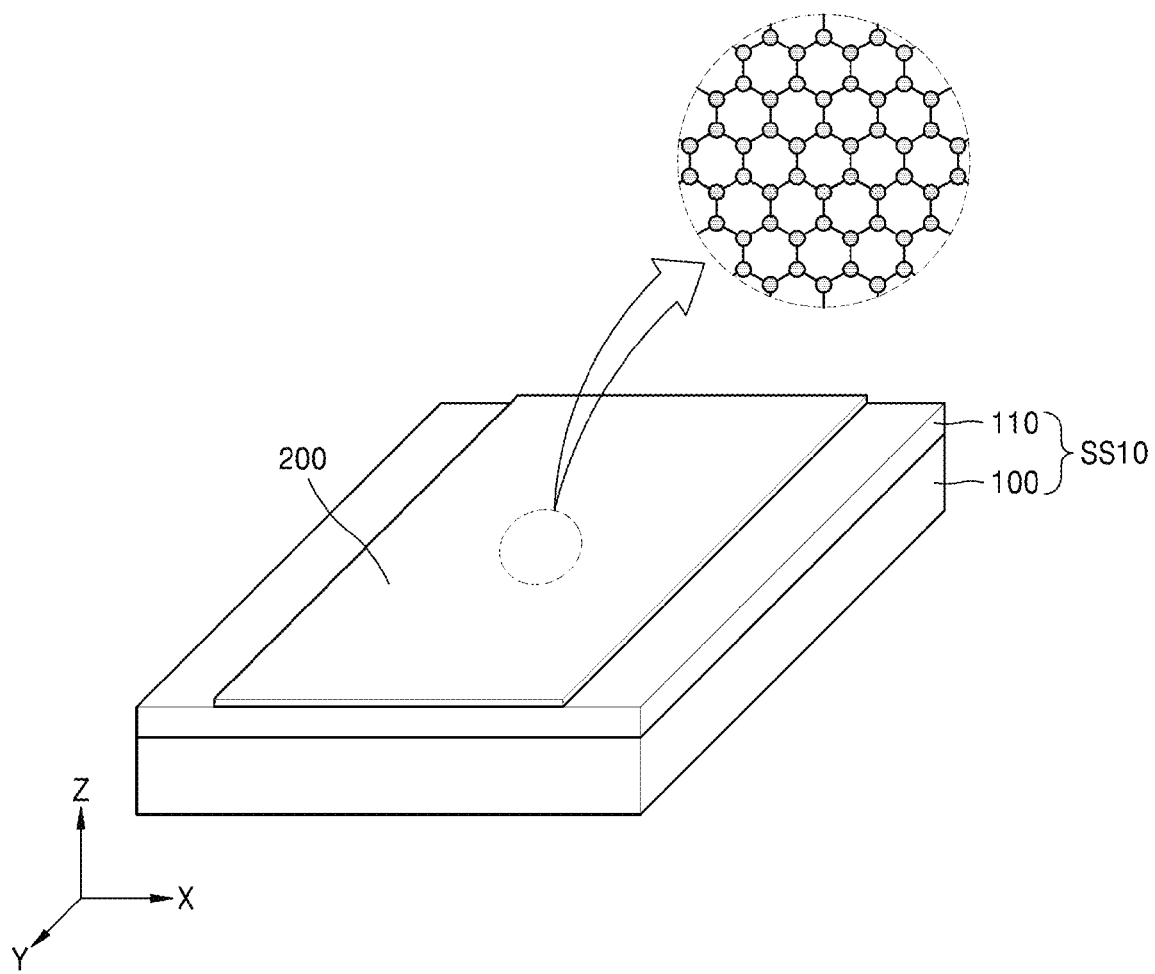
FIGS. 1A-1E are perspective views for explaining a method of forming a graphene nanopattern, according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, methods of forming graphene nanopatterns, graphene-containing devices, and methods of manufacturing the graphene-containing devices, according to example embodiments of the present invention, will be described more fully with reference to the accompanying drawings. In the drawings, the widths and thicknesses of layers and regions are exaggerated for clarity and convenience in explanation. Like reference numerals in the drawings denote like elements.

FIGS. 1A through 1E are perspective views for explaining a method of forming a graphene nanopattern, according to example embodiments.

Referring to FIG. 1A, a graphene layer 200 may be provided on a substrate 100. An underlayer 110 may be formed on the substrate 100, and the graphene layer 200 may be formed on the underlayer 110. The substrate 100 may be a semiconductor substrate such as a silicon substrate. In this case, the underlayer 110 may be, for example, an insulation layer such as a silicon oxide layer. The insulation layer may include a hydrophilic material. However, the material used to form the substrate 100 is not limited to Si, and the substrate 100 may include a semiconductor other than Si, or an insulator or a conductor. The material used to form the underlayer 110 may vary. The underlayer 110 may include an inorganic insulative layer other than a silicon oxide layer. For example, the underlayer 110 may include a silicon nitride layer or a high dielectric material layer (e.g., a material layer having a higher dielectric constant than a silicon nitride material), or an organic insulative layer including insulative polymer. In some cases, the underlayer 110 may include a semiconductor layer or a conductive layer. The underlayer 110 may have a single-layered structure or a multi-layered structure. The substrate 100 and the underlayer 110 may constitute a single substrate or a single substrate structure. Alternatively, the substrate 100 and the underlayer 110 may constitute a single underlayer or a single understructure. For convenience of explanation, a combination of the substrate 100 and the underlayer 110 will now be referred to as a substrate structure SS10. Use of the underlayer 110 may be optional.

The width of the graphene layer 200 may be less than a width of the substrate 100 in at least one dimension. For example, the width of the graphene layer 200 may be less than the substrate 100 in an X-axis direction. In this case, a region of the substrate structure SS10 on at least one side of the graphene layer 200 in the X-axis direction may be exposed. Herein, a case where regions of the substrate structure SS10 on both sides of the graphene layer 200 in the X-axis direction are exposed is illustrated. The width of the graphene layer 200 in the X-axis direction may be, for example, several tens of nm to several hundreds of nm. The width of the graphene layer 200 in the X-axis direction may be about 20 nm or more and may be about 200 nm or less. The graphene layer 200 may have a structure that extends in the Y-axis direction. In other words, a length of the graphene layer 200 in a Y-axis direction may be greater than the width thereof in the X-axis direction. The graphene layer 200 may include about 1 to about 100 layers (or about 1 to about 10 layers) of graphene. In other words, the graphene layer GP10 may include a single graphene layer or a stack of about 100 or less graphene layers (or about 10 or less graphene layers). A planar (two-dimensional) crystal structure of the graphene layer 200 may be the same as shown in a partial magnified view on an upper side in FIG. 1A. In other words, the graphene layer 200 may have a hexagonal structure composed of carbon atoms. The graphene layer 200 may be grown on another substrate (not shown) and then transferred to the substrate structure SS10, or may be directly grown on the substrate 100 or the underlayer 110. Methods of growing and transferring the graphene layer 200 are well known, and thus detailed descriptions thereof will not be included herein.

Figure 1B:
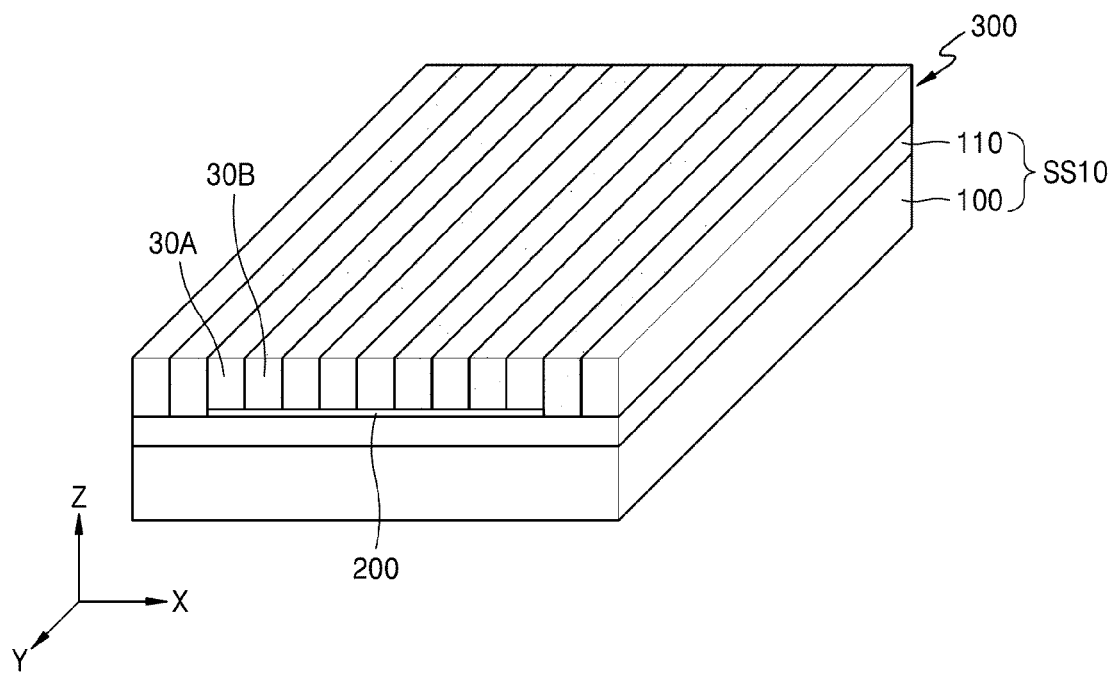

Referring to FIG. 1B, a block copolymer layer 300 may be formed on the graphene layer 200 and the exposed regions of the substrate structure SS10. The block copolymer layer 300 may directly contact the graphene layer 200 and the exposed regions of the substrate structure SS10. The block copolymer layer 300 may include a plurality of first regions 30A and a plurality of second regions 30B arranged parallel to the graphene layer 200. The plurality of first regions 30A may be regions including a first polymer, and the plurality of second regions 30B may be regions including a second polymer that is different from the first polymer. The first and second regions 30A and 30B may alternate with each other. The first regions 30A and the second regions 30B may be alternately arranged in the X-axis direction that is perpendicular to an extension direction (Y-axis direction) of the graphene layer 200. In other words, the first and second regions 30A and 30B may be alternately arranged in a width direction of the graphene layer 200. In this case, one of the plurality of first regions 30A and the plurality of second regions 30B, for example, one of the plurality of first regions 30A, may be arranged along an edge portion of the graphene layer 200. One of the plurality of first regions 30A may be arranged along a first edge portion of the graphene layer 200, and another of the plurality of first regions 30A may be arranged along a second edge portion of the graphene layer 200. The first and second edge portions may correspond to both ends of the graphene layer 200 in the X-axis direction. As such, a second region 30B and a first region 30A may alternate with each other on either side of the first region 30A arranged on the edge portion of the graphene layer 200. The block copolymer layer 300 may be formed using a directed self-assembly (DSA) method assisted by the edge portion of the graphene layer 200 without using a topological guide pattern. This will now be described in detail below.

One of the first regions 30A and the second regions 30B of the block copolymer layer 300 may be hydrophobic, and the other may be hydrophilic. In other words, the first polymer that forms the first regions 30A and the second polymer that forms the second regions 30B may be hydrophobic and hydrophilic, respectively, or vice versa. In this connection, the term "hydrophobic" and the term "hydrophilic" may be relative terms. That is, the first polymer being hydrophobic means that the first polymer is relatively more hydrophobic than the second polymer. Similarly, the second polymer being hydrophilic means that the second polymer is relatively more hydrophilic than the first polymer. After a thin film is formed by coating a surface of the graphene layer 200 and regions of the substrate structure SS10 on both sides of the graphene layer 200 with a solution (polymer solution) in which the first polymer and the second polymer are mixed in a desired (and/or alternatively predetermined) solvent, the thin film may be annealed, thereby forming the block copolymer layer 300. During the annealing, since the graphene layer 200 and the exposed regions of the substrate structure SS10 on both sides thereof have different surface characteristics, the first polymer and the second polymer may be self-arranged in a regular pattern. Consequently, the block copolymer layer 300, in which the first region 30A including the first polymer and the second region 30B including the second polymer alternate with each other, may be formed. In this case, one of the plurality of first regions 30A may be arranged along the edge portion of the graphene layer 200. This formation of the block copolymer layer 300 may be understood as being achieved via the DSA assisted by the edge portion of the graphene layer 200. Accordingly, when the block copolymer layer 300 is formed, a topological guide pattern for inducing a self arrangement of the block copolymer layer 300 may not be needed.

Figure 2A:
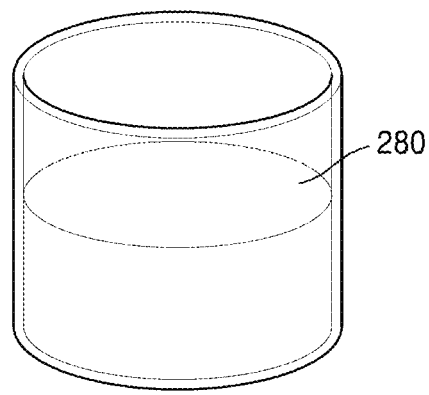
FIGS. 2A-2C are perspective views for explaining a method of forming a block copolymer layer illustrated in FIG. 1B.
Figure 2B:
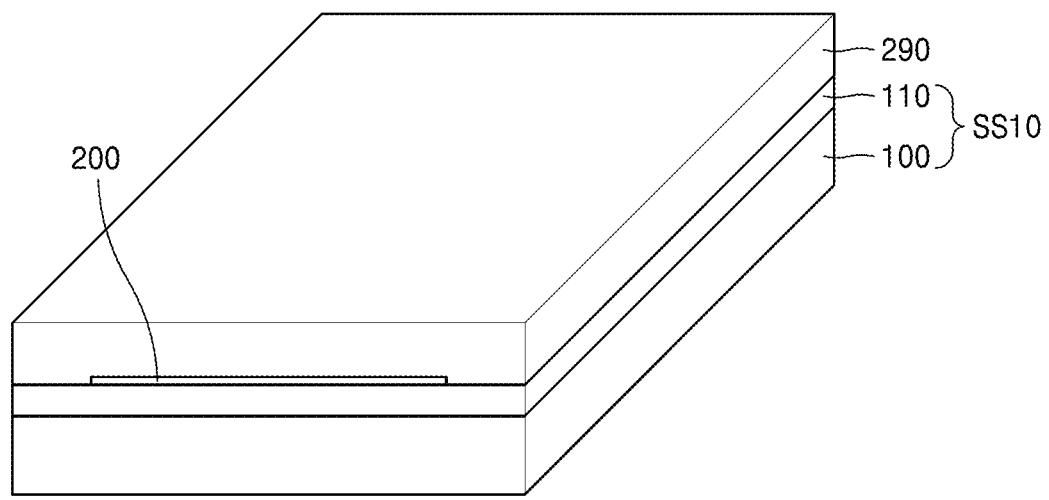
Figure 2C:
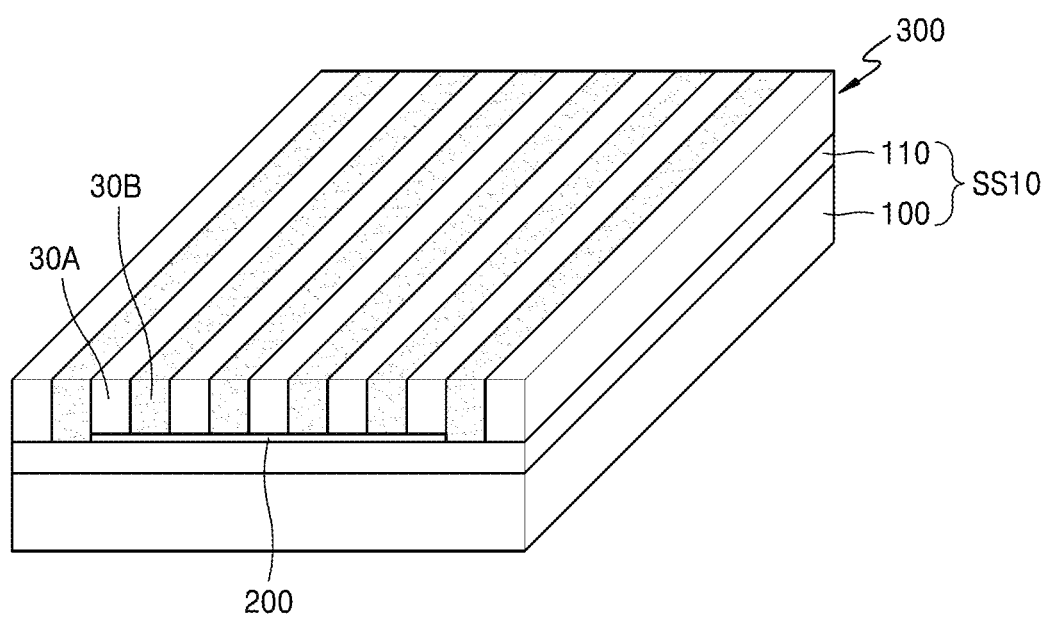

The above-described method of forming the block copolymer layer 300 may be the same as shown in FIGS. 2A-2C. The above-described method of forming the block copolymer layer 300 will now be described in more detail with reference to FIGS. 2A-2C.

Referring to FIG. 2A, a polymer solution 280 including a block copolymer may be prepared. The polymer solution 280 may be made by dissolving the block copolymer in a desired (and/or alternatively predetermined) solvent. The block copolymer may include a hydrophobic first polymer and a hydrophilic second polymer. The desired (and/or alternatively predetermined) solvent may be, for example, an organic solvent such as cyclohexane. Also, toluene, a toluene/THF (tetrahydrofuran) mixed solution, xylene, or ethlybenzene may be used as the desired (and/or alternatively predetermined) solvent. However, the aforementioned solvent materials are non-limiting examples, and various other solvent materials may be used.

Referring to FIG. 2B, a thin film 290 may be formed by coating a surface of the graphene layer 200 and regions of the substrate structure SS10 on both sides of the graphene layer 200 with the polymer solution 280. The thin film 290 may be formed by using, for example, a spin coating method. The thin film 290 may be referred to as a polymer thin film. Next, the thin film 290 may undergo annealing. The annealing may be thermal annealing or solvent annealing. The thermal annealing may be performed at, for example, about 150 to about 350° C. The solvent annealing may be performed in a desired (and/or alternatively predetermined) solvent atmosphere. Conditions such as an annealing temperature or a solvent atmosphere may vary according to the type of polymer included in the thin film 290. In some cases, the annealing may be performed as a drying process at room temperature or a temperature similar thereto.

As a result of the annealing described above with reference to FIG. 2B, a block copolymer layer 300, as shown in FIG. 2C, may be formed. The block copolymer layer 300 may have a structure in which the plurality of first regions 30A and the plurality of second regions 30B are self-arranged. Since the graphene layer 200 and the exposed regions of the substrate structure SS10 on both sides thereof may have different surface characteristics, the first polymer and the second polymer in the thin film 290 may be self-arranged in a regular pattern during the annealing. For example, since the graphene layer 200 may be hydrophobic and the exposed regions of the underlayer 110 on both sides thereof may be hydrophilic, a portion of the first polymer may be arranged along the edge portion of the graphene layer 200, and the second polymer and the first polymer may be alternately arranged on either side of the edge portion. Consequently, as shown in FIG. 2C, the block copolymer layer 300, in which the first regions 30A and the second region 30B alternate with each other, may be formed. According to the molecular weights of the polymers (the first and second polymers) that constitute the block copolymer layer 300, the width of each of the first regions 30A and the second regions 30B may vary. For example, the first regions 30A and the second regions 30B may each have a width of about 5 to about 50 nm according to the molecular weights of polymers that constitute the first and second regions 30A and 30B. Thus, by changing the type of polymer, the widths of the first regions 30A and the second regions 30B may be adjusted. However, the above-described formation principle and structure of the block copolymer layer 300 are non-limiting examples, and a formation principle and a structure of the block copolymer layer 300 may vary.

A block copolymer that is used in the method of FIGS. 2A-2C, namely, a block copolymer used in the block copolymer layer 300 of FIG. 1B, may be one selected from the group consisting of: a block copolymer of a polymer of styrene or a derivative thereof as a repeating unit and a polymer of (meth)acrylic acid ester as a repeating unit; a block copolymer of a polymer of styrene or a derivative thereof as a repeating unit and a polymer of siloxane or a derivative thereof as a repeating unit; a block copolymer of a polymer of styrene or a derivative thereof as a repeating unit and an olefin-based polymer; a block copolymer of a polymer of styrene or a derivative thereof as a repeating unit and a polymer of alkylene oxide as a repeating unit; and a block copolymer of a polymer of alkylene oxide as a repeating unit and a polymer of (meth)acrylic acid ester as a repeating uniting unit. As specific examples, the block copolymer may include one of PS-b-PDMS, PS-b-P4VP, PS-b-P2VP, PS-b-PEO, PS-b-PAA, PS-b-PB, PS-b-PI, PI-b-P4VP, PI-b-P2VP, PI-b-PEO, PI-b-PAA, PMMA-b-P4VP, PMMA-b-P2VP, PMMA-b-PEO, PMMA-b-PAA, PS-b-PMA, PS-b-PMMA, PI-b-PMA, PI-b-PMMA, PMMA-b-PMA, PS-b-PS-OH, and PI-b-PS-OH. Full names of the above-described block copolymers are listed below.

PS-b-PDMS: polystyrene-block-polydimethylsiloxane
PS-b-P4VP: polystyrene-block-poly(4-vinylpyridine)
PS-b-P2VP: polystyrene-block-poly(2-vinylpyridine)
PS-b-PEO: polystyrene-block-poly(ethylene oxide)
PS-b-PAA: polystyrene-block-poly(acrylic acid)
PS-b-PB: polystyrene-block-polybutadiene
PS-b-PI: polystyrene-block-polyisoprene
PI-b-P4VP: polyisoprene-block-poly(4-vinylpyridine)
PI-b-P2VP: polyisoprene-block-poly(2-vinylpyridine)
PI-b-PEO: polyisoprene-block-poly(ethylene oxide)
PI-b-PAA: polyisoprene-block-poly(acrylic acid)
PMMA-b-P4VP: poly(methyl methacrylate)-block-poly(4-vinylpyridine)
PMMA-b-P2VP: poly(methyl methacrylate)-block-poly(2-vinylpyridine)
PMMA-b-PEO: poly(methyl methacrylate)-block-poly(ethylene oxide)
PMMA-b-PAA: poly(methyl methacrylate)-block-poly(acrylic acid)
PS-b-PMA: polystyrene-block-poly(methacrylic acid)
PS-b-PMMA: polystyrene-block-poly(methyl methacrylate)
PI-b-PMA: polyisoprene-block-poly(methacrylic acid)
PI-b-PMMA: polyisoprene-block-poly(methyl methacrylate)
PMMA-b-PMA: poly(methyl methacrylate)-block-poly(methacrylic acid)
PS-b-PS-OH: polystyrene-block-poly(hydroxystyrene)
PI-b-PS-OH: polyisoprene-block-poly(hydroxystyrene)

Among the above-described block copolymers, as an example, the "PS" of PS-b-PDMS may be the hydrophobic first polymer and the "PDMS" thereof may be the hydrophilic second polymer. The "PS" of PS-b-P4VP may be the hydrophobic first polymer and the "P4VP" thereof may be the hydrophilic second polymer. Similarly to this, the "PS" of PS-b-P2VP may be the hydrophobic first polymer and the "P2VP" thereof may be the hydrophilic second polymer. The "PS" of PS-b-PEO may be the hydrophobic first polymer and the "PEO" thereof may be the hydrophilic second polymer. However, the aforementioned materials for the block copolymer are non-limiting examples, and various other materials may be used to form the block copolymer. The method of FIGS. 2A-2C is an example method of forming the block copolymer layer 300 of FIG. 1B, and thus the block copolymer layer 300 may be formed using various other methods.

As shown in FIG. 1B, after the block copolymer layer 300 including the plurality of first regions 30A and the plurality of second regions 30B is formed, the plurality of first regions 30A or the plurality of second regions 30B may be removed. A result of removing the plurality of first regions 30A from the block copolymer layer 300 is illustrated in FIG. 1C.

Figure 1C:
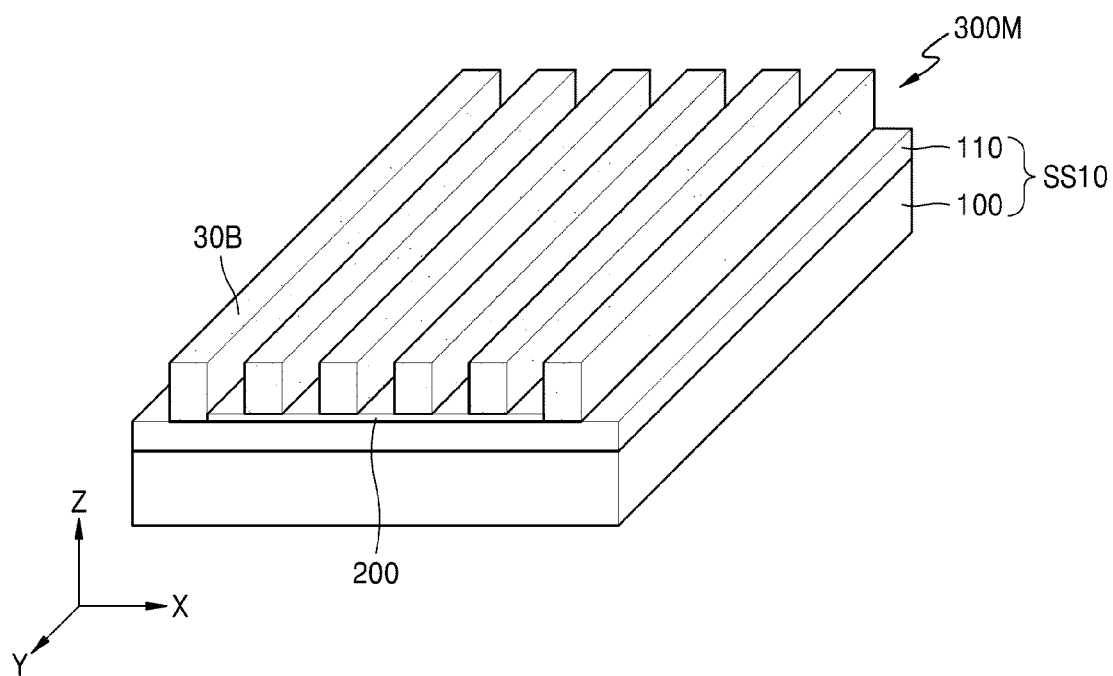

Referring to FIG. 1C, due to the removal of the plurality of first regions 30A, regions of the graphene layer 200 between the plurality of second regions 30B may be exposed. In this case, the plurality of second regions 30B may be considered to constitute a single mask pattern 300M. The plurality of first regions 30A of FIG. 1B may be removed by using a reactive ion etching (RIE) method using an oxygen-containing base (e.g., $O_2$ gas). However, the RIE method is only an example, and a method of removing the first regions 30A of FIG. 1B may vary according to the type of polymer that constitutes the first regions 30A. As such, the mask pattern 300M formed by removing the plurality of first regions 30A of FIG. 1B may have a nanoscale fine pattern.

Figure 1D:
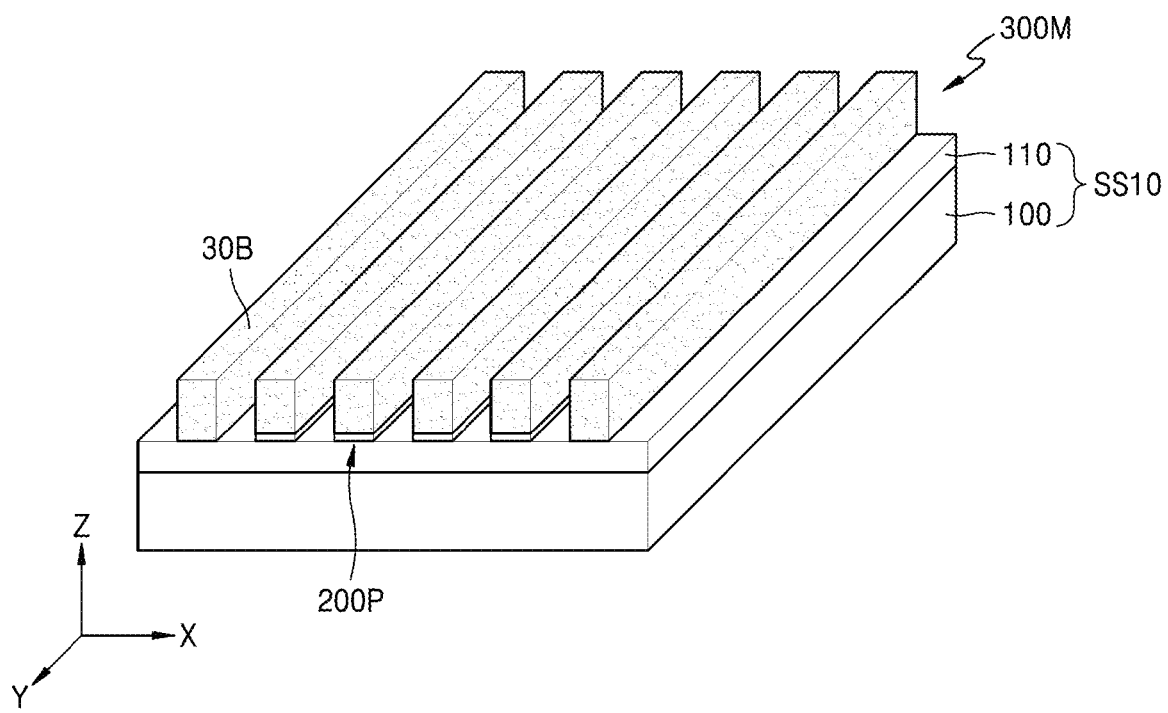

Referring to FIG. 1D, the graphene layer 200 may be patterned using the mask pattern 300M as an etching mask. Consequently, a graphene nanopattern 200P may be formed. The graphene layer 200 may be finely/precisely patterned in a nanoscale by using the mask pattern 300M. The graphene layer 200 may be patterned (etched) using $O_2$ plasma, Ar plasma, or $CF_4$-based plasma, or may be patterned (etched) by RIE. The graphene layer 200 may be patterned (etched) using Group VII-based gas such as F or Cl. The graphene layer 200 may be patterned (etched) using various other methods. In the operation of FIG. 1D, when an etching time for the graphene nanopattern 200P is extended, lateral etch of the graphene nanopattern 200P may be conducted, and unit patterns 20P (see FIG. 1E) that constitute the graphene nanopattern 200P may each be formed to have a smaller width than the second regions 30B.

Figure 1E:
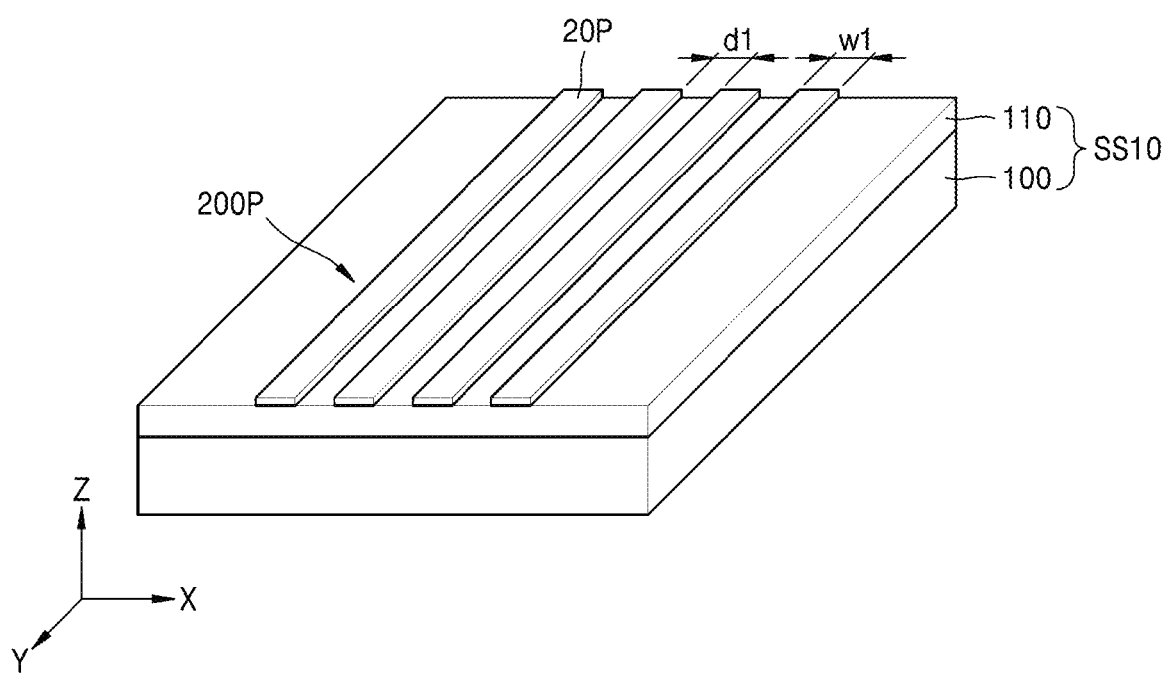

Next, when the mask pattern 300M is removed, a structure as shown in FIG. 1E may be obtained. The mask pattern 300M may be etched out using a desired (and/or alternatively predetermined) etchant. For example, the mask pattern 300M, namely, the plurality of second regions 30B, may be removed using an etch solution such as a buffered oxide etchant (BOE).

In FIG. 1E, the graphene nanopattern 200P may have a structure in which a plurality of unit patterns 20P are arrayed. A width w1 of each unit pattern 20P may be about 15 nm or less or about 10 nm or less. The width w1 of each unit pattern 20P may be about 7 nm or less or about 5 nm or less. A distance d1 between two adjacent unit patterns 20P may be about 15 nm or less or about 10 nm or less. The distance d1 may be about 7 nm or less or about 5 nm or less. The width w1 and the distance d1 of each unit pattern 20P may be generally determined by a dimension of the mask pattern 300M of FIG. 1C, and the dimension of the mask pattern 300M may be determined by dimensions of the first and second regions 30A and 30B of the self-arranged block copolymer layer 300 of FIG. 1B. The first and second regions 30A and 30B of the self-arranged block copolymer layer 300 of FIG. 1B may each have a width of about 15 nm or less or about 10 nm or less. Consequently, as described above, the width w1 and the distance d1 of the graphene nanopattern 200P of FIG. 1E may be about 15 nm or less or about 10 nm or less. Thus, according to example embodiments, the graphene nanopattern 200P having a ultrafine pattern of about 10 nm or less or about 5 nm or less may be easily formed. A graphene nanopattern 200P having a stripe pattern, as shown in FIG. 1E, may be referred to as a graphene nanoribbon (GNR) array. However, in some cases, the width w1 and the distance d1 of the graphene nanopattern 200P may be several tens of nm (for example, ~50 nm).

When a graphene layer is patterned in a nanoscale, a patterned graphene layer may exhibit semiconductor characteristics. When the dimension and shape of the patterned graphene layer are controlled, the characteristics thereof may be controlled. However, it may not be easy to pattern a graphene layer in a nanoscale of about 10 nm or less by using some lithography methods. For example, top-down type lithography (e.g., existing extreme ultraviolet (EUV) lithography, electron-beam lithography, or scanning tunneling microscope (STM) lithography), bottom-up type lithography, a graphoepitaxy method using a guide pattern, or a method of forming a nanopattern by cutting carbon nanotubes (CNTs) may be inappropriate for a large-area process and commercialization, or may be inappropriate to easily form a graphene nanopattern having a desired size (for example, a width of about 10 nm or less) and a desired shape. In particular, as for a graphoepitaxy method using a guide pattern, various problems/limitations may exist due to the use of the guide pattern. For example, as the guide pattern is formed, a process may become complicated, or dead zones may greatly increase. In addition, the guide pattern may make it difficult to manufacture a multi-layered device and also make it difficult to manufacture various devices.

However, according to example embodiments, without using topological guide patterns, a graphene nanopattern having a width of about 10 nm or less or about 5 nm or less may be easily formed using a directed self-assembly (DSA) method assisted by the edge portion of the graphene layer. Thus, various problems/limitations due to use of the guide pattern may be limited (and/or prevented). In other words, compared with the case of using a guide pattern, a process may be more simplified, dead zones may be greatly reduced, and a multi-layered device and various devices may be favorably implemented. In addition, by adjusting the size/shape of an initial graphene layer and the molecular amounts of the polymers used in a block copolymer layer, a graphene nanopattern having a desired size and a desired shape may be easily formed. Moreover, example embodiments may be applied to a large-area process, and may be appropriate as a commercialization process for mass production. The large-area process will be described later in more detail with reference to FIGS. 11-14. As such, according to example embodiments, a high-density graphene nanopattern having a pattern width of about 10 nm or less may be easily manufactured via a large-area process, and a size, a shape, a location, and the like of the high-density graphene nanopattern may be easily controlled.

In the method of FIGS. 1A-1E, when the width of an initial graphene layer, namely, the graphene layer 200 of FIG. 1A, is changed, the number of unit patterns 20P included in the finally formed graphene nanopattern 200P of FIG. 1E may be changed. The change in the graphene nanopattern 200P according to the change in the width of the initial graphene layer 200 may be the same as shown in FIGS. 3 and 4.

Figure 3:
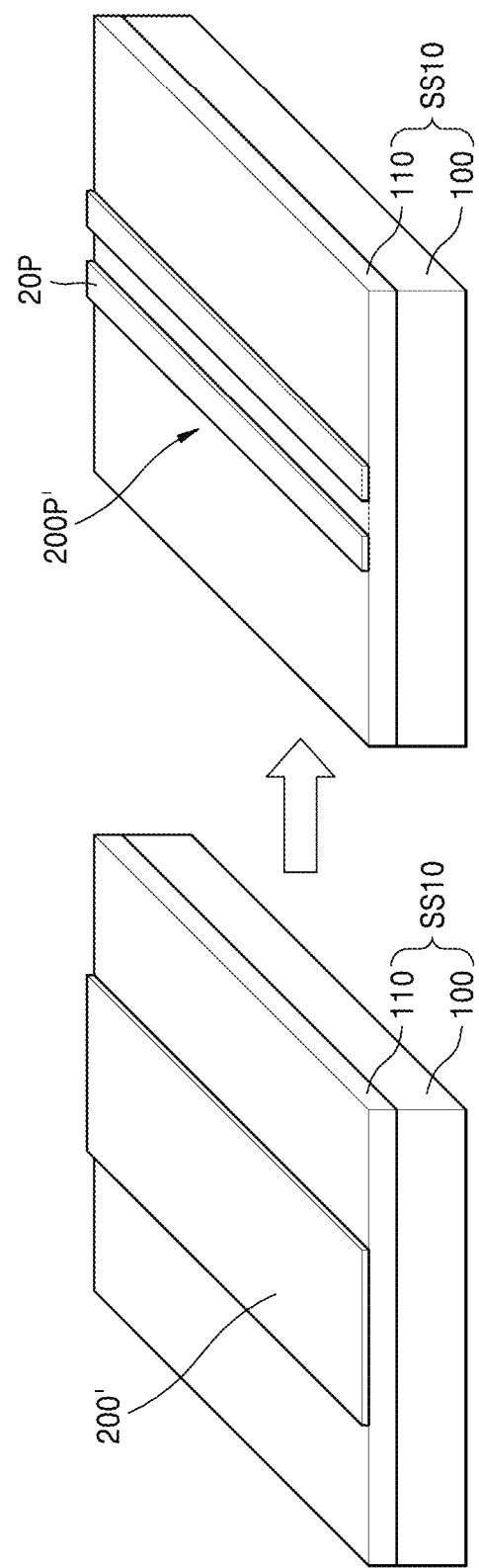
FIG. 3 is a perspective view for explaining a method of forming a graphene nanopattern, according to example embodiments.
Figure 4:
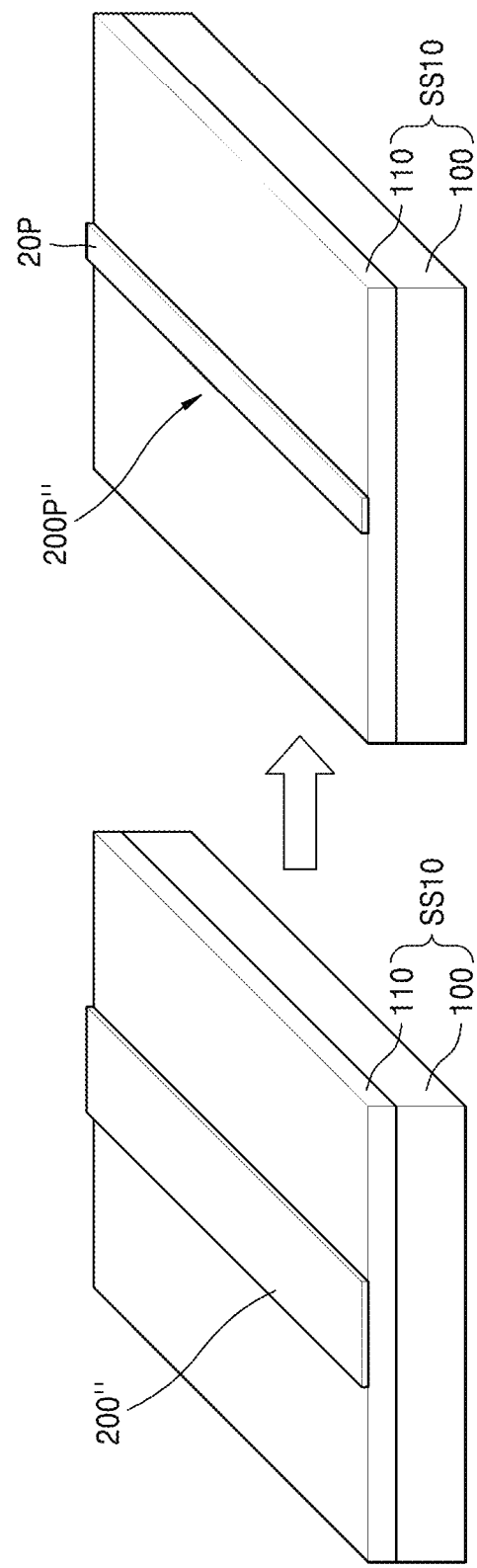
FIG. 4 is a perspective view for explaining a method of forming a graphene nanopattern, according to example embodiments.

Referring to FIGS. 3 and 4, as widths of initial graphene layers 200' and 200" change, the numbers of unit patterns 20P that constitute finally formed graphene nanopatterns 200P' and 200P" may change. In FIGS. 3 and 4, left drawings may represent an operation corresponding to FIG. 1A, right drawings may represent an operation corresponding to FIG. 1E, and intermediate operations between the two operations (namely, operations corresponding to FIGS. 1B-1D) are omitted for convenience of explanation.

As described above with reference to FIGS. 3 and 4, by changing the widths of the initial graphene layers 200' and 200'', the structures of the finally formed graphene nanopatterns 200P' and 200P'' may be easily changed.

In FIGS. 1A to 1E, 2A to 2C, 3, and 4, the graphene layers 200, 200', and 200'' have straight line shapes. However, according to example embodiments, the graphene layers 200, 200', and 200'' have curved line shapes. For example, a method of forming a graphene nanopattern, according to example embodiments, will now be described with reference to FIGS. 5A-5D.

Figure 5A:
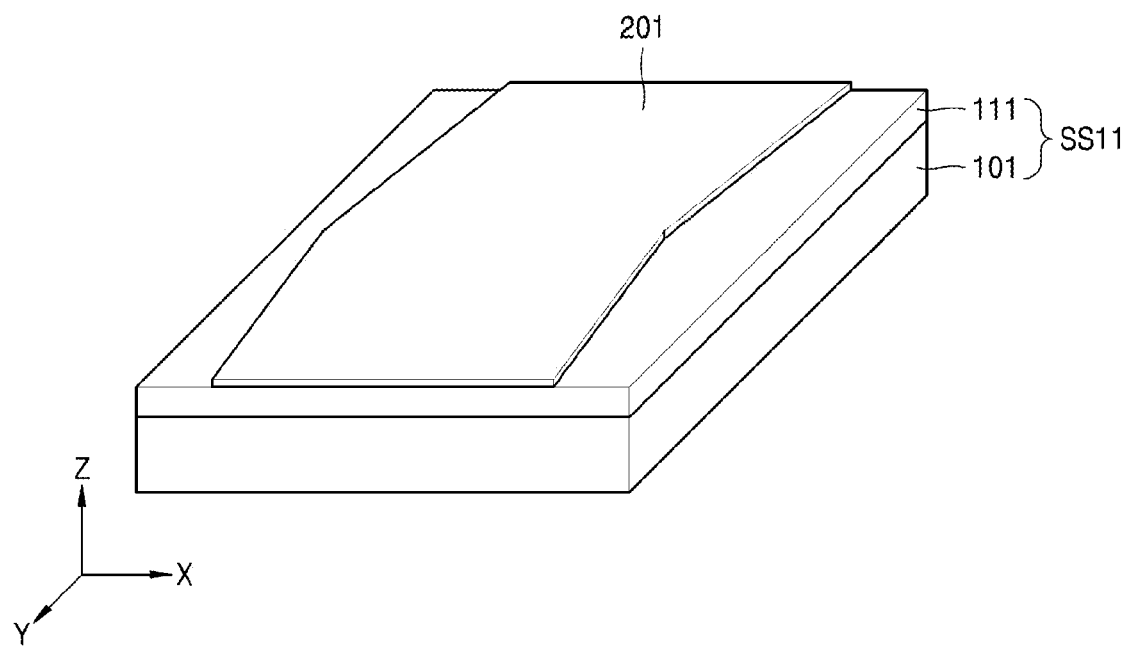
FIGS. 5A-5D are perspective views for explaining a method of forming a graphene nanopattern, according to example embodiments.

Referring to FIG. 5A, an underlayer 111 may be formed on a substrate 101. A combination of the substrate 101 and the underlayer 111 may be considered a single substrate structure SS11. The substrate 101 and the underlayer 111 may correspond to the substrate 100 and the underlayer 110 of FIG. 1A, respectively. The underlayer 111 may not be included. A graphene layer 201 may be formed on the substrate structure SS11. The graphene layer 201 may have a curved shape. A region of the substrate structure SS11 on at least one side, for example, both sides, of the graphene layer 201 in the X-axis direction may be exposed.

Figure 5B:
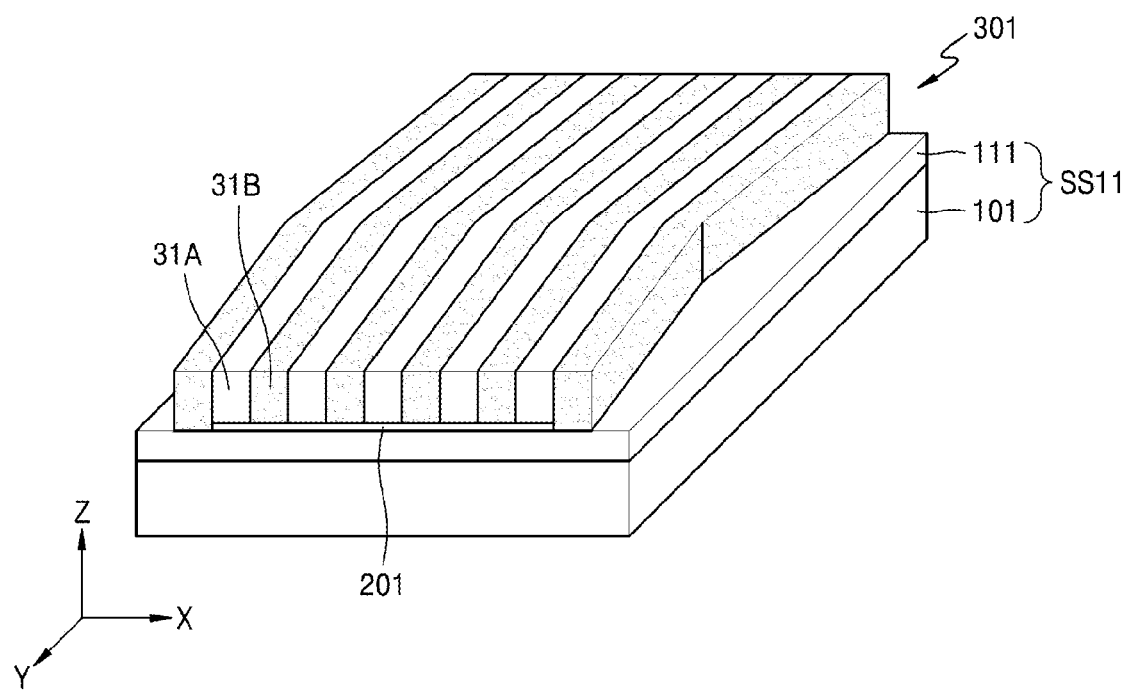

Referring to FIG. 5B, a block copolymer layer 301 may be formed on the graphene layer 201 and the exposed regions of the substrate structure SS11 on both sides of the graphene layer 201. The block copolymer layer 301 may include a plurality of first regions 31A and a plurality of second regions 31B arranged parallel to the graphene layer 201. One of the plurality of first regions 31A or the plurality of second regions 31B may be arranged along an edge portion of the graphene layer 201. The block copolymer layer 301 may be formed via a directed self-assembly (DSA) method assisted by the edge portion of the graphene layer 201, similar to the block copolymer layer 300 of FIG. 1B. The first and second regions 31A and 31B of the block copolymer layer 301 may have curved shapes corresponding to the curved shape of the graphene layer 201.

Figure 5C:
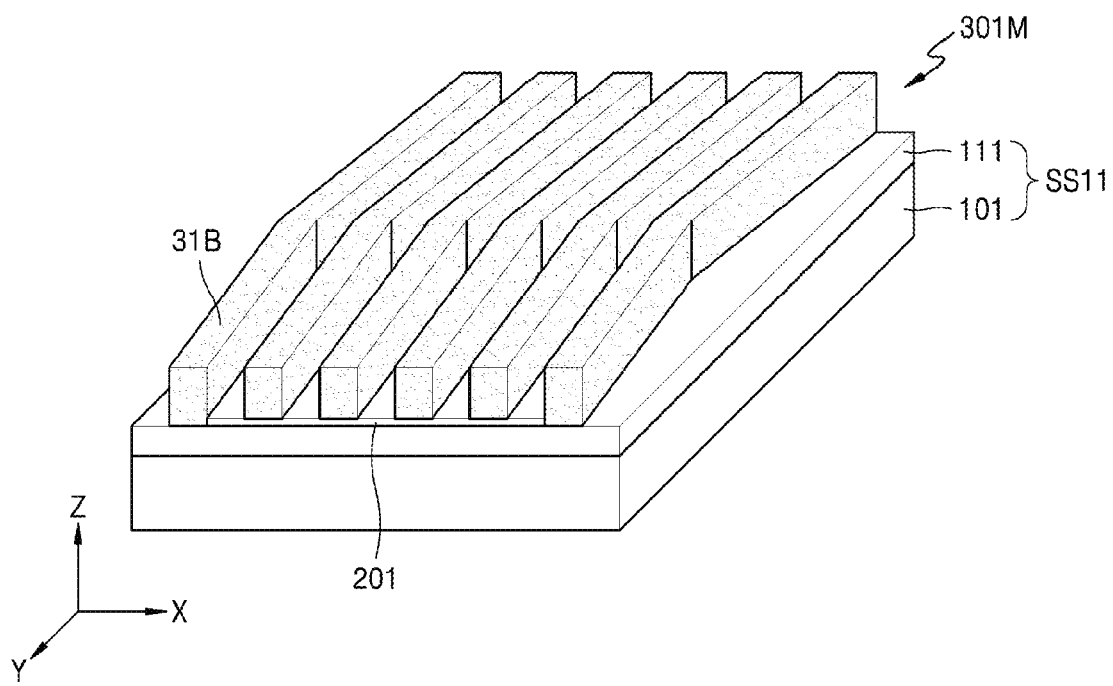

Referring to FIG. 5C, a mask pattern 301M may be formed by removing the plurality of first regions 31A or the plurality of second regions 31B from the block copolymer layer 301. In example embodiments, the plurality of first regions 31A are removed. A method of removing the plurality of first regions 31A may be substantially the same as the description above with reference to FIG. 1C.

Figure 5D:
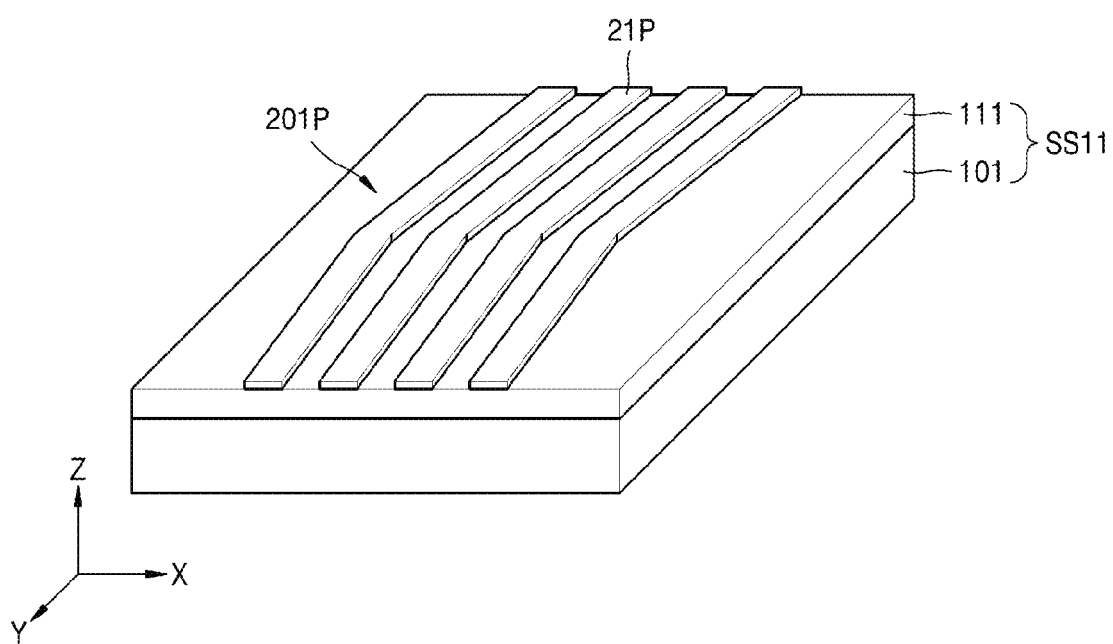

Next, the graphene layer 201 may be patterned in a nanoscale by using the mask pattern 301M as an etch mask, and then the mask pattern 301M may be removed. Consequently, a graphene nanopattern 201P, as shown in FIG. 5D, may be obtained. The graphene nanopattern 201P may include at least one unit pattern 21P. The graphene nanopattern 201P has a similar structure to the graphene nanopatterns 200P of FIG. 1E, but may have a curved shape. The unit patterns 21P of the graphene nanopattern 201P may be considered as a GNR having a curved shape.

As such, according to the shape of the initial graphene layer 201, the shape of the graphene nanopattern 201P may be changed. The shapes of the initial graphene layer 201 and the graphene nanopattern 201P described with reference to FIGS. 5A-5D are non-limiting examples, and the shapes of the initial graphene layer 201 and the graphene nanopattern 201P may vary.

Figure 6:
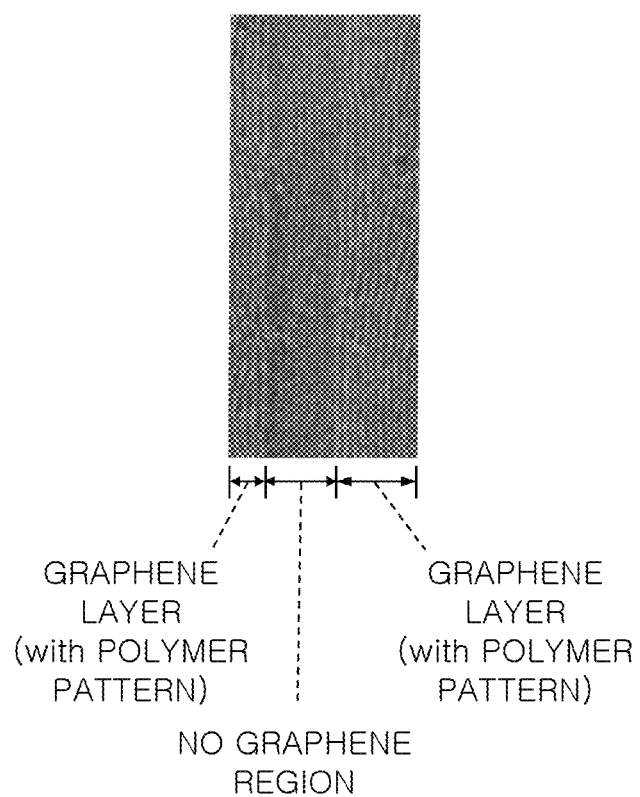
FIG. 6 is a scanning electron microscope (SEM) image showing a mask pattern formed on a graphene layer by using a block copolymer, according to example embodiments.

FIG. 6 is a scanning electron microscope (SEM) image showing a mask pattern formed on a graphene layer by using a block copolymer, according to example embodiments. FIG. 6 may correspond to the operation of FIG. 1C.

Referring to FIG. 6, the graphene layer may have a straight line shape or a shape that is approximately a straight line, and polymer regions of the mask pattern are arranged along edge portions of the graphene layer. The polymer regions may correspond to the second regions 30B of FIG. 1C.

Figure 7:
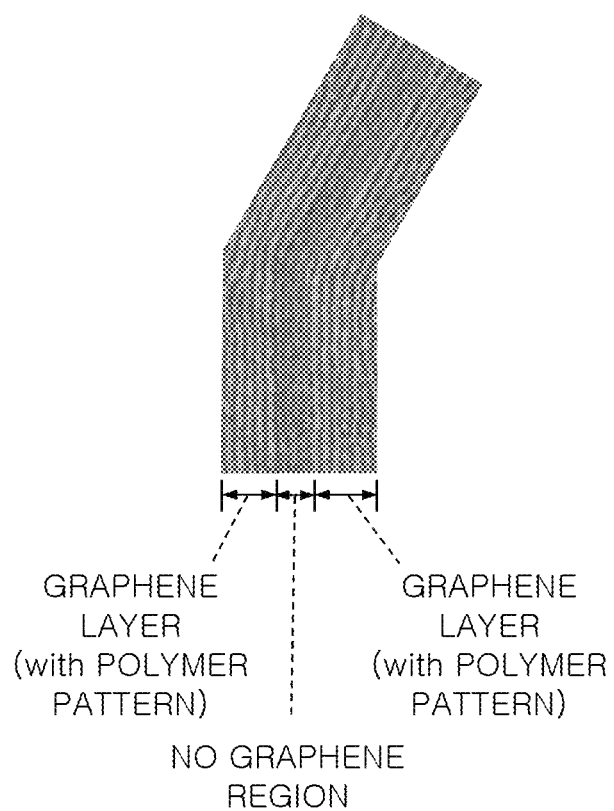
FIG. 7 is an SEM image showing a mask pattern formed on a graphene layer by using a block copolymer, according to example embodiments.

FIG. 7 is an SEM image showing a mask pattern formed on a graphene layer by using a block copolymer, according to example embodiments. FIG. 7 may correspond to the operation of FIG. 5C.

Referring to FIG. 7, the graphene layer may have a curved line shape or a shape that is approximately a curved line, and polymer regions of the mask pattern are arranged along edge portions of the graphene layer. The polymer regions may correspond to the second regions 31B of FIG. 5C.

According to example embodiments, in the operations of FIGS. 1B and 5B, the plurality of first regions 30A and 31A or the plurality of second regions 30B and 31B may form continuous layer structures. This is illustrated in FIG. 8.

Figure 8:
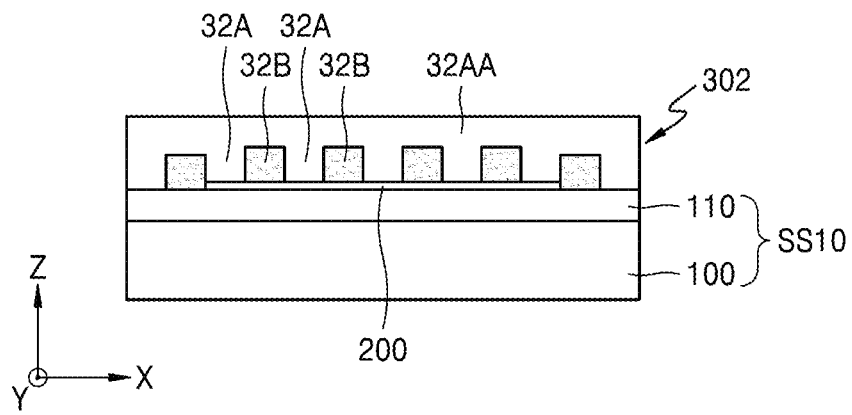
FIG. 8 is a cross-sectional view for explaining a method of forming a graphene nanopattern, according to example embodiments.

Referring to FIG. 8, a block copolymer layer 302 may include a plurality of first regions 32A and a plurality of second regions 32B arranged in a direction parallel to the graphene layer 200. In this case, the plurality of first regions 32A may be connected to one another to form a continuous layer structure 32AA. In the continuous layer structure 32AA, the plurality of second regions 32B are arranged apart from one another at regular intervals. When the continuous layer structure 32AA comprised of the plurality of first regions 32A is removed from the block copolymer layer 302, the plurality of second regions 32B may remain, and the graphene layer 200 may be patterned using the remaining second regions 32B as a mask pattern. The mask pattern may be similar to the mask pattern 300M of FIG. 1C.

Various modifications may be made to the structure of the block copolymer layer 302 of FIG. 8. For example, each of the plurality of second regions 32B may have a cylinder shape or a shape similar thereto, and the plurality of second regions 32B may be somewhat separated from a bottom surface of the block copolymer layer 302. This modification is illustrated in FIG. 9.

Figure 9:
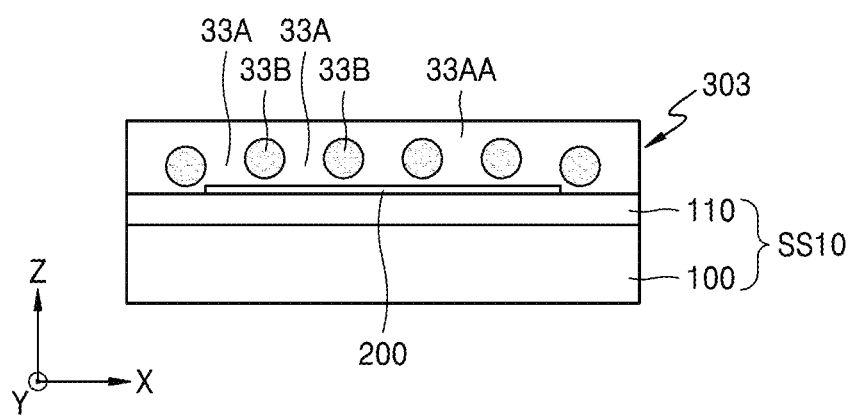
FIG. 9 is a cross-sectional view for explaining a method of forming a graphene nanopattern, according to example embodiments.

Referring to FIG. 9, a block copolymer layer 303 may have a structure in which a plurality of second regions 33B are arranged apart from one another at regular intervals in a continuous layer structure 32AA. Each of the plurality of second regions 33B may have a cylinder shape or a shape similar thereto, and the plurality of second regions 33B may be arranged in a direction parallel to the substrate 100 or the graphene layer 200 (for example, the Y-axis direction). The plurality of second regions 33B may be somewhat separated from a bottom surface of the block copolymer layer 303. Thus, the plurality of second regions 33B may be somewhat spaced apart from the graphene layer 200. A plurality of first regions 33A may be considered to be disposed between the plurality of second regions 33B, and the plurality of first regions 33A may be considered to form the continuous layer structure 33AA. The plurality of first regions 33A may be removed from the block copolymer layer 303, and the graphene layer 200 may be patterned using the remaining second regions 33B as a mask pattern. The mask pattern may be similar to the mask pattern 300M of FIG. 1C.

Although not shown in FIG. 9, the block copolymer layer 303 may further include an upper layer formed on the continuous layer structure 33AA. The upper layer may include the same material as the plurality of second regions 33B. In this case, after the upper layer is first removed, the plurality of first regions 33A constituting the continuous layer structure 33AA may be removed, thereby obtaining a mask pattern comprised of the plurality of second regions 33B. Various modifications may be made to the shape of the block copolymer layer 303.

According to example embodiments, in the method of FIGS. 1A-1E, after the graphene layer 200 is formed directly on the substrate 100 without using the underlayer 110, subsequent processes may be conducted. This will now be described in detail with reference to FIG. 10.

Figure 10:
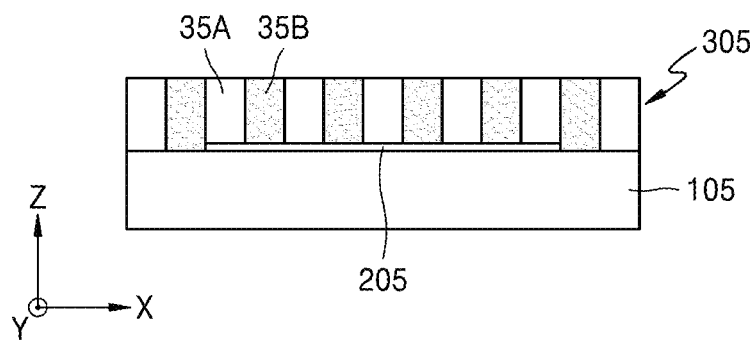
FIG. 10 is a cross-sectional view for explaining a method of forming a graphene nanopattern, according to example embodiments.

Referring to FIG. 10, a graphene layer 205 may be formed on a substrate 105. The substrate 105 may be an insulative substrate including, for example, an insulator. In some cases, the substrate 105 may include a semiconductor or a conductor. The graphene layer 205 may be the same as or similar to the graphene layer 200 described above with reference to FIG. 1A. A block copolymer layer 305 may be formed on the graphene layer 200 and a region of the substrate 105 around the graphene layer 200. The block copolymer layer 305 may be the same as or similar to the block copolymer layer 300 of FIG. 1B. In other words, the block copolymer layer 305 may include a plurality of first regions 35A and a plurality of second regions 35B arranged parallel to the graphene layer 205. In this case, one of the plurality of first regions 35A or the plurality of second regions 35B may be arranged along an edge portion of the graphene layer 205. The block copolymer layer 305 may be formed via a directed self-assembly (DSA) method assisted by the edge portion of the graphene layer 205. Thereafter, although not shown in FIG. 10, the graphene layer 205 may be patterned using a method similar to the method of FIGS. 1C-1E.

Graphene nanopattern forming methods according to example embodiments may be applied to large-area substrates, for example, wafer-scale substrates. Cases where graphene nanopattern forming methods according to example embodiments have been applied to large-area substrates, for example, wafer-scale substrates, will now be described with reference to FIGS. 11-14.

Figure 11:
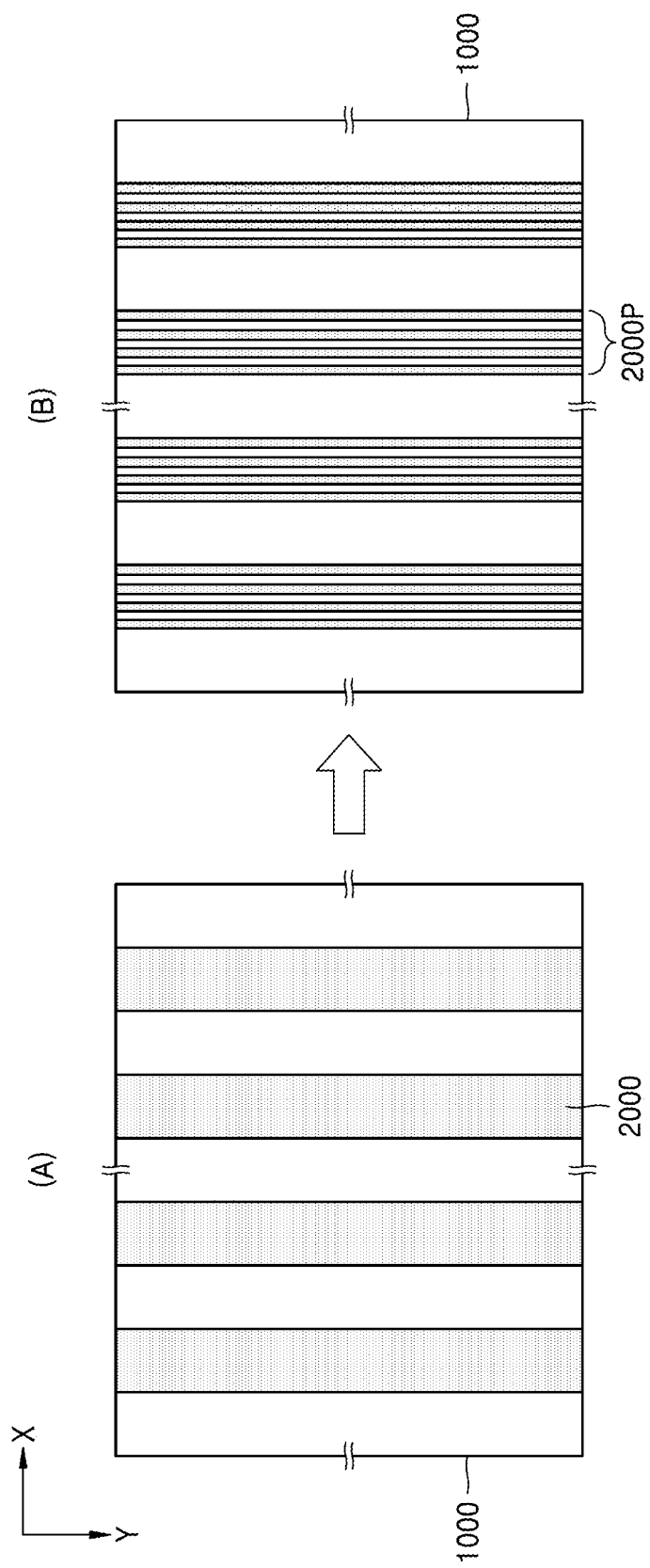
FIGS. 11A-11B are plan views for explaining a method of forming a graphene nanopattern, according to example embodiments.

FIG. 11 is a plan view for explaining a method of forming a graphene nanopattern, according to example embodiments. FIG. 11 describes a non-limiting example of a case of forming graphene nanopatterns on a wafer-scale substrate.

Referring to FIG. 11, a plurality of graphene layers 2000 may be formed on a substrate 1000. The substrate 1000 may be a wafer-scale substrate. The substrate 1000 may have a diameter of several inches or more. A material used to form the substrate 1000 and a layer structure of the substrate 1000, for example, may correspond to those of the substrate structure SS10 of FIG. 1A or the substrate 105 of FIG. 10. In other words, a wafer-scale magnification of the substrate structure SS10 of FIG. 1A or the substrate 105 of FIG. 105 may correspond to the substrate 1000 of FIG. 11.

Each of the plurality of graphene layers 2000 may be similar to the graphene layer 200 of FIG. 1A. After a large-area graphene sheet is provided on the substrate 1000, the graphene sheet may be patterned by using a desired (and/or alternatively predetermined) method to form the plurality of graphene layers 2000. Thus, the plurality of graphene layers 2000 may be referred to as a patterned graphene layer. The plurality of graphene layers 2000 may be disposed apart from one another in the X-axis direction and may each extend in the Y-axis direction. A width of each graphene layer 2000 in the X-axis direction may be, for example, several tens of nm to several hundreds of nm. The width of each graphene layer 2000 in the X-axis direction may be about 20 nm or more and may be about 200 nm or less. A distance between two adjacent graphene layers 2000 may be several tens of nm or less, for example, about 50 nm or less or about 20 nm or less.

The plurality of graphene layers 2000 in FIG. 11 may undergo processes similar to the processes of FIGS. 1B-1E. Consequently, a resultant structure as in FIG. 11 may be obtained. Referring to FIG. 11, a graphene nanopattern 2000P may be formed from each graphene layer 2000. Each graphene nanopattern 2000P may be similar to the graphene nanopattern 200P of FIG. 1E. After a block copolymer layer (not shown) is formed on the plurality of graphene layers 2000 and regions of the substrate 1000 around the plurality of graphene layers 2000, a mask pattern may be formed from the block copolymer layer, and the plurality of graphene layers 2000 may be patterned using the mask pattern as an etch mask.

Figure 12:
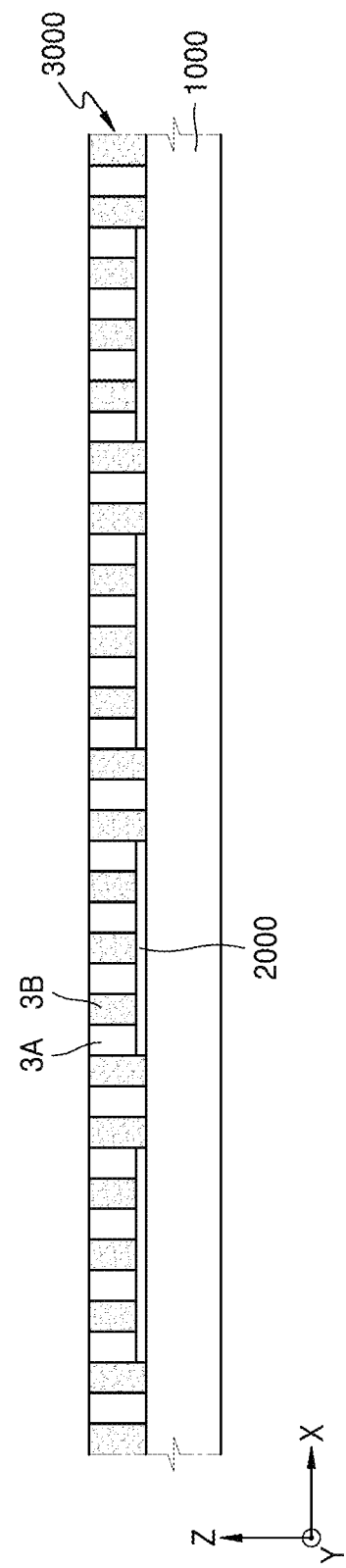
FIG. 12 is a cross-sectional view showing a case where a block copolymer layer is formed on a plurality of graphene layers illustrated in FIG. 11.

FIG. 12 is a cross-sectional view showing a case where a block copolymer layer 3000 is formed on the plurality of graphene layers 2000 of FIG. 11. Referring to FIG. 12, the block copolymer layer 3000 may include a plurality of first regions 3A and a plurality of second regions 3B. The first and second regions 3A and 3B may alternate with each other in a direction parallel to the graphene layers 2000, for example, in the X-axis direction. First regions 3A may be arranged on edge portions of each graphene layer 2000. Although not shown in FIG. 12, after a mask pattern is formed by removing the plurality of first regions 3A or the plurality of second regions 3B from the block copolymer layer 3000, the plurality of graphene layers 2000 may be patterned using the mask pattern as an etch mask, thereby forming graphene nanopatterns 2000P as shown in FIG. 11.

Figure 13:
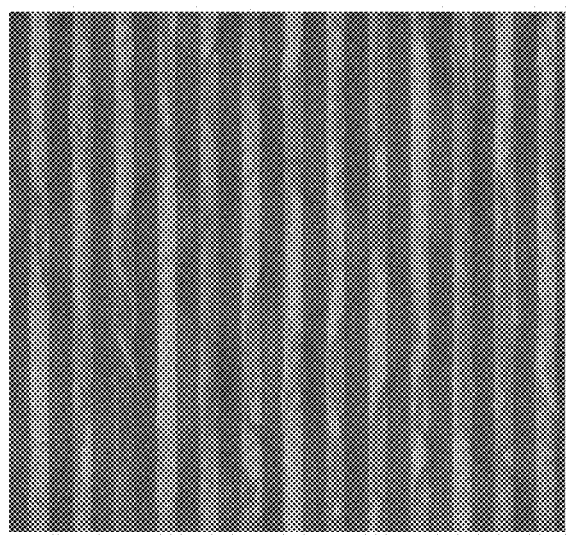
FIG. 13 is an SEM image showing a structure corresponding to FIG. 11.

FIG. 13 is an SEM image showing a structure corresponding to the graphene layers 2000 in FIG. 11. Referring to FIG. 13, a plurality of graphene layers are formed on a substrate. Each graphene layer has a width of about 200 nm. A plurality of nanopatterns may be formed from the plurality of graphene layers.

Figure 14:
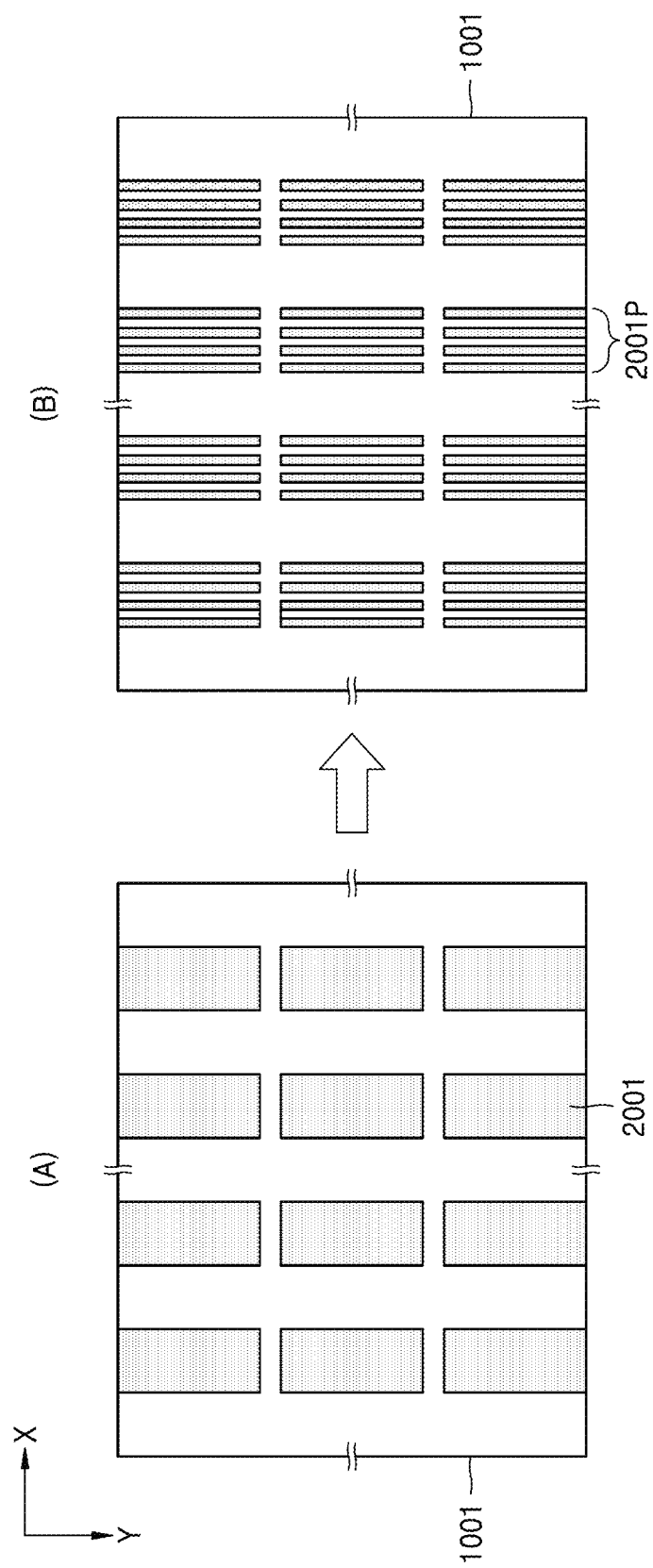
FIGS. 14A-14B are plan views for explaining a method of forming a graphene nanopattern, according to example embodiments.

FIG. 14 is a plan view for explaining a method of forming a graphene nanopattern, according to example embodiments. FIG. 14 is a modification of FIG. 11.

Referring to FIG. 14, a plurality of graphene layers 2001 may be formed on a substrate 1001. The plurality of graphene layers 2001 may be arranged apart from one another in the X-axis direction (width direction) and the Y-axis direction (length direction). The plurality of graphene layers 2001 may be similar to a result of patterning each graphene layer 2000 of FIG. 11 in the Y-axis direction (length direction) to form a discontinuous structure. The plurality of graphene layers 2001 may be arranged in the Y-axis direction so as to form a plurality of columns, and each of the plurality of columns may include at least two graphene layers 2001.

The plurality of graphene layers 2001 in FIG. 14 may undergo processes similar to the processes of FIGS. 1B-1E. Consequently, a resultant structure including graphene nanopatterns 2001P, as shown in FIG. 14, may be obtained. Referring to FIG. 14, a graphene nanopattern 2001P may be formed on each graphene layer 2001. Each graphene nanopattern 2001P may be similar to the graphene nanopattern 200P of FIG. 1E.

For reference, each graphene layer 2001 of FIG. 14 includes edge portions of both ends thereof in the X-axis direction and also includes edge portions of both ends thereof in the Y-axis direction. Under the influence of the edge portions of each graphene layer 2001 in the Y-axis direction, an arrangement of a block copolymer formed on the edge portions may be somewhat different from that on a remaining region of each graphene layer 2001, namely, a region of the graphene layer 2001 except for the edge portions in the Y-axis direction. However, a regular arrangement of a block copolymer as described above with reference to FIG. 1B may be achieved on the remaining region of each graphene layer 2001 except for the edge portions in the Y-axis direction. In addition, since the edge portions of each graphene layer 2001 in the Y-axis direction may be regions on which electrodes are generally formed, even when a nanopattern has a somewhat irregular shape on these regions, the somewhat irregular shape may not greatly affect characteristics/operations of a device including the nanopattern.

Various modifications may be made to the shapes and arrangements of the plurality of graphene layers 2000 and 2001 of FIG. 11 and FIG. 14, and accordingly various modifications may be made to the shapes and arrangements of the graphene nanopatterns 2000P and 2001P. After the plurality of graphene nanopatterns 2000P of FIG. 11 are formed, the plurality of graphene nanopatterns 2000P may be patterned in a desired shape. For example, by patterning the plurality of graphene nanopatterns 2000P of FIG. 11 using a general method, a structure similar to the graphene nanopatterns 2001P in FIG. 14 may be obtained.

Graphene nanopattern forming methods according to example embodiments may be applied to the manufacture of various devices. A method of manufacturing a graphene-containing device will now be described by applying a graphene nanopattern forming method according to example embodiments.

Figure 15A:
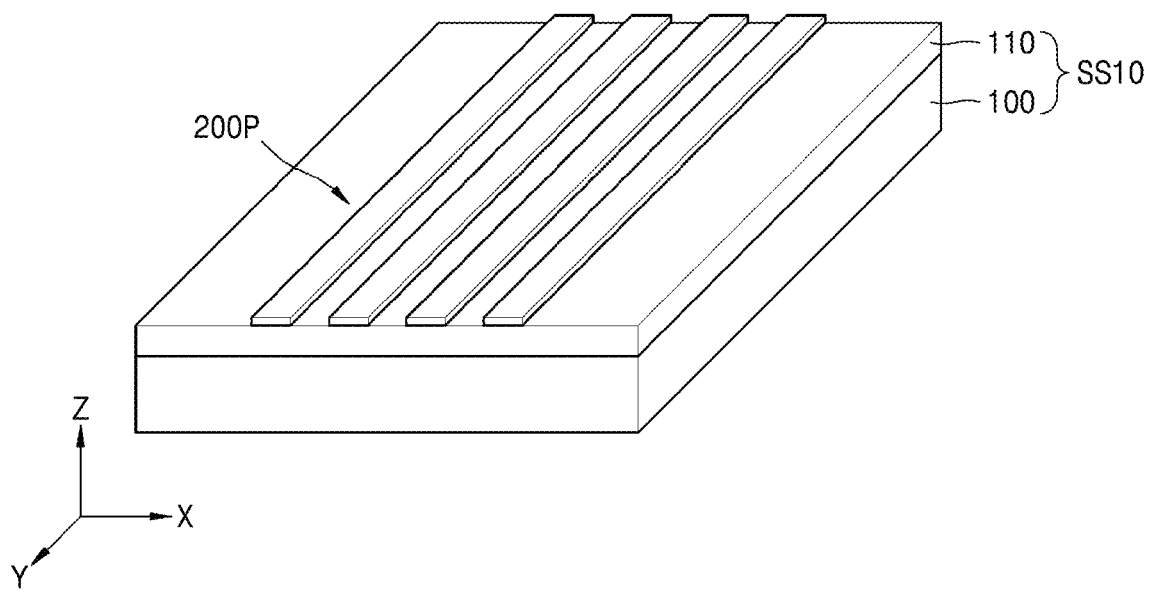
FIGS. 15A-15C are perspective views for explaining a method of manufacturing a graphene-containing device, according to example embodiments.
Figure 15B:
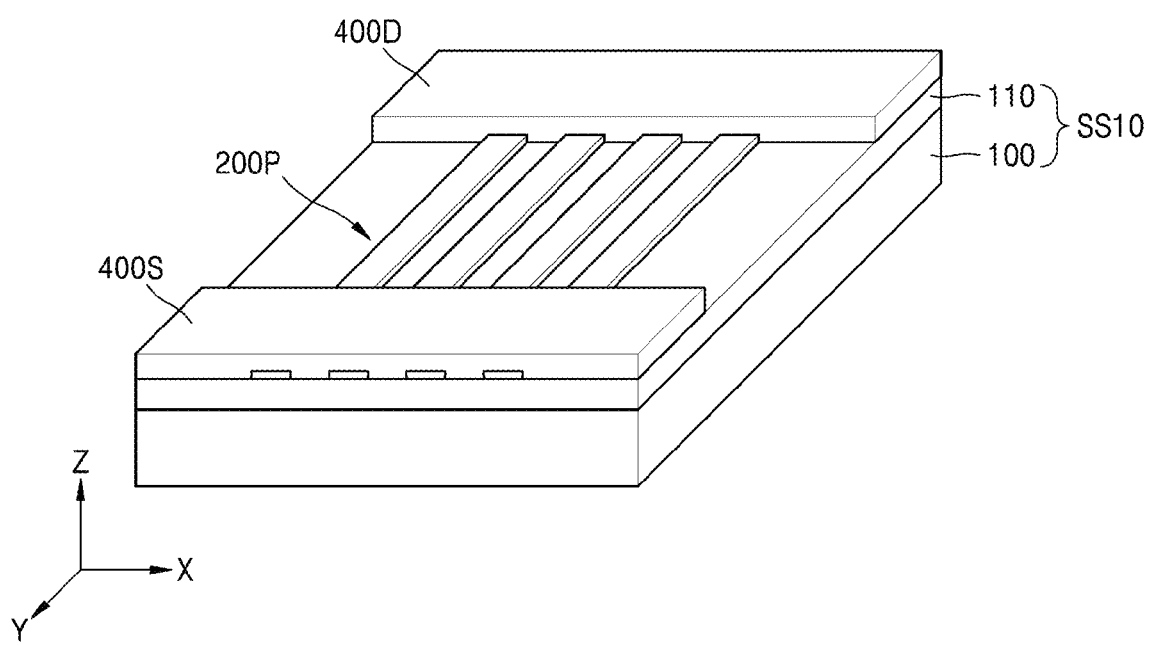
Figure 15C:
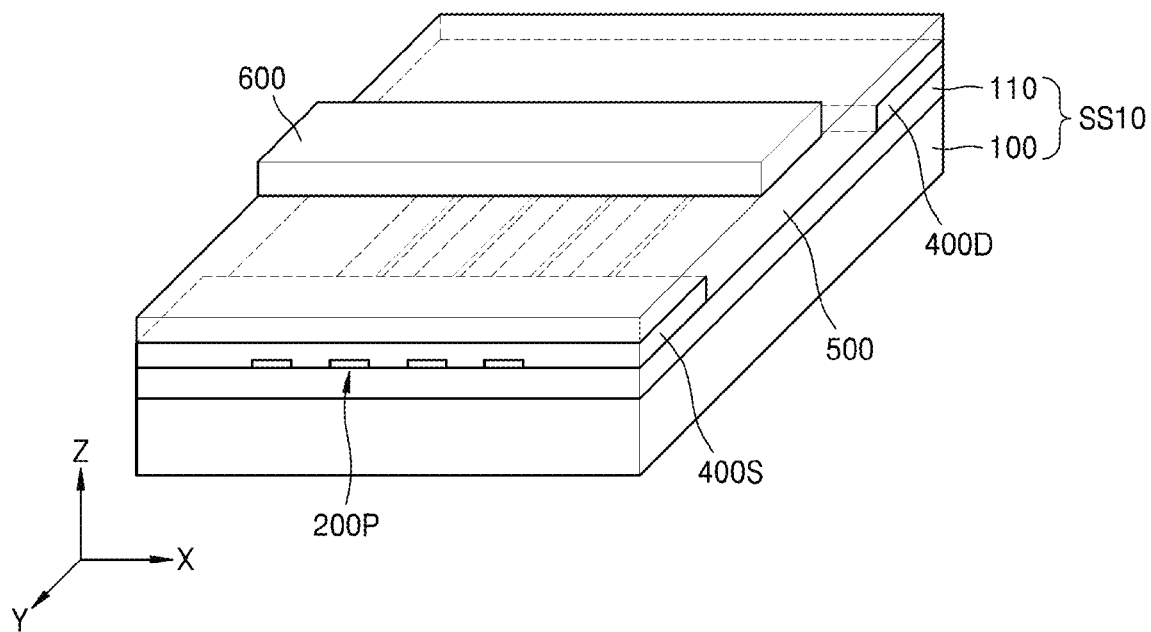

FIGS. 15A-15C are perspective views for explaining a method of manufacturing a graphene-containing device, according to example embodiments. FIGS. 15A to 15C relate to a non-limiting example where the graphene-containing device is a transistor. The transistor may have a top-gate structure.

Referring to FIG. 15A, a structure in which a graphene nanopattern 200P is formed on a substrate structure SS10 may be prepared. The structure of FIG. 15A may be formed using the method of FIGS. 1A-1E. Reference numeral 100 indicates a substrate, and reference numeral 110 indicates an underlayer.

Referring to FIG. 15B, a source electrode 400S and a drain electrode 400D respectively contacting (connected to) both ends of the graphene nanopattern 200P may be formed. The source electrode 400S and the drain electrode 400D may be formed of metal or a metal compound, for example, and may each have a single-layered or multi-layered structure. In some cases, the source electrode 400S and the drain electrode 400D may be formed of graphene. The materials used to form the source electrode 400S and the drain electrode 400D are not particularly restricted, and any material may be used as long as it is capable of being used for an electrode of a general electronic device (semiconductor device).

Referring to FIG. 15C, a gate insulation layer 500 covering the graphene nanopattern 200P, the source electrode 400S, and the drain electrode 400D may be formed on the substrate structure SS10. A gate 600 may be formed on the gate insulation layer 500. The materials used to form the gate insulation layer 500 and the gate 600 are not particularly restricted, and various materials that are used in general transistors may be applied. The gate 600 may be understood as being a top-gate. The graphene nanopattern 200P may be used as a channel layer of a transistor. Since the graphene nanopattern 200P is a nanoscale pattern, the graphene nanopattern 200P may exhibit good semiconductor characteristics.

According to example embodiments, a transistor having a bottom-gate structure may be manufactured by using the substrate 100 of FIG. 15A as a bottom-gate and using the underlayer 110 of FIG. 15A as a gate insulation layer. A description of a bottom-gate transistor according to example embodiments is described subsequently with reference to FIGS. 16A and 16B.

Figure 16A:
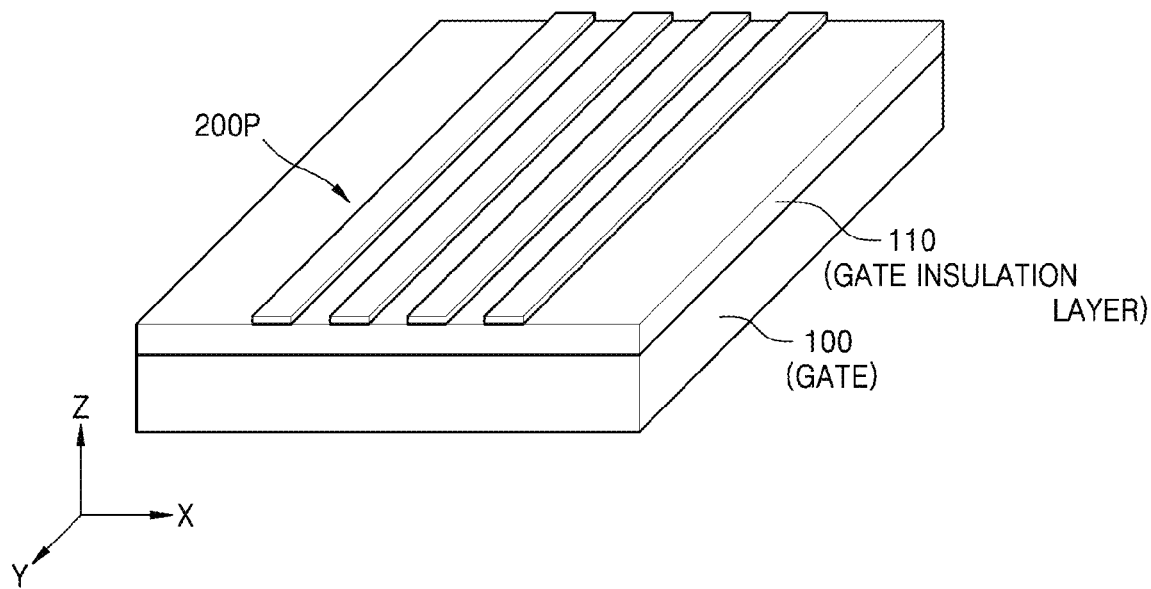
FIGS. 16A and 16B are perspective views for explaining a method of manufacturing a graphene-containing device, according to example embodiments.

Referring to FIG. 16A, a structure in which the underlayer 110 is formed on the substrate 100 and the graphene nanopattern 200P is formed on the underlayer 110 may be formed using the method of FIGS. 1A-1E. In this case, the substrate 100 may be a gate (bottom-gate), and the underlayer 110 may be a gate insulation layer. If the substrate 100 is a semiconductor substrate such as a Si substrate, the substrate 100 may be doped with high-concentration conductive impurities and thus may be used as a gate. When the substrate 100 is formed of a metallic material (conductive material), the substrate 100 may be used as a gate without being doped.

Figure 16B:
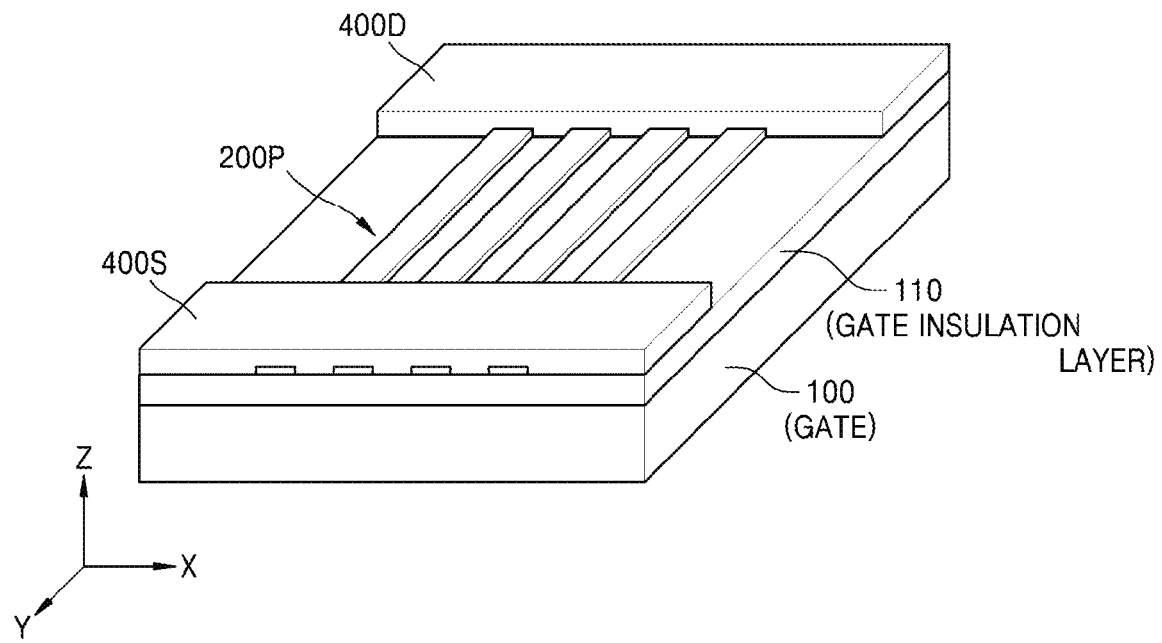

Referring to FIG. 16B, the source electrode 400S and the drain electrode 400D respectively contacting (connected to) both ends of the graphene nanopattern 200P may be formed. This may be substantially the same as the description above with reference to FIG. 15B. The graphene nanopattern 200P may be used as a channel layer of a transistor.

According to example embodiments, a different bottom gate may be formed on a substrate, a gate insulation layer (underlayer) covering the bottom gate may be formed, and then the gate insulation layer (underlayer) may undergo a transistor manufacturing process. A description of a transistor including a different bottom gate according to example embodiments is described subsequently with reference to FIGS. 17A-17C.

Figure 17A:
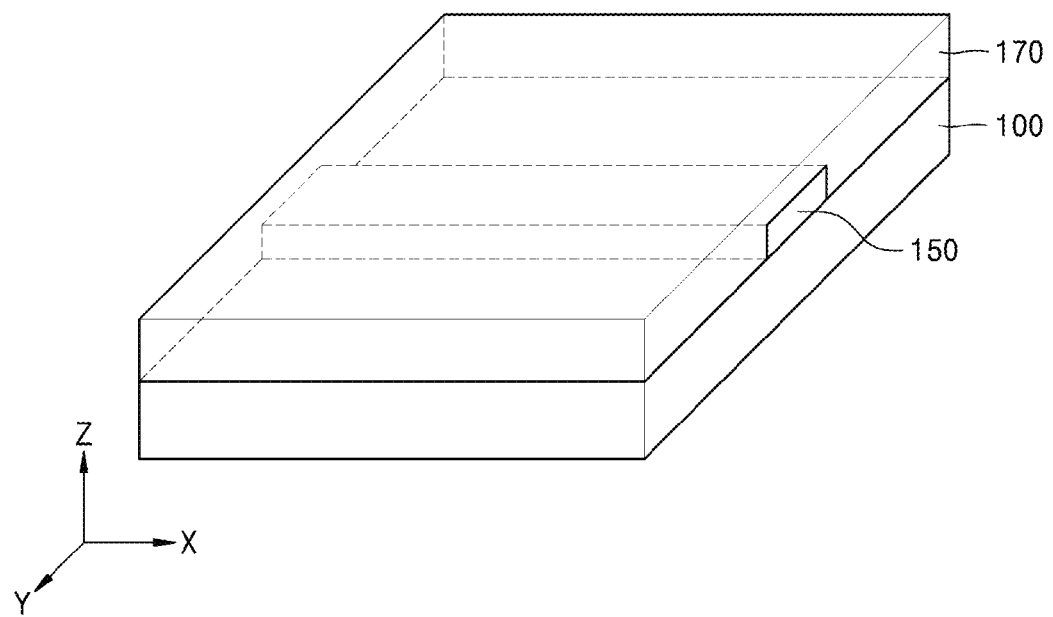
FIGS. 17A-17C are perspective views for explaining a method of manufacturing a graphene-containing device, according to example embodiments.

Referring to FIG. 17A, a gate 150 may be formed on the substrate 100, and a gate insulation layer (underlayer) 170 covering the gate 150 may be formed over the substrate 100 and the gate 150. The gate 150 may be a bottom gate. The material used to form the gate insulation layer (underlayer) 170 may be the same as or similar to the material used to form the underlayer 110 of FIG. 1A.

Figure 17B:
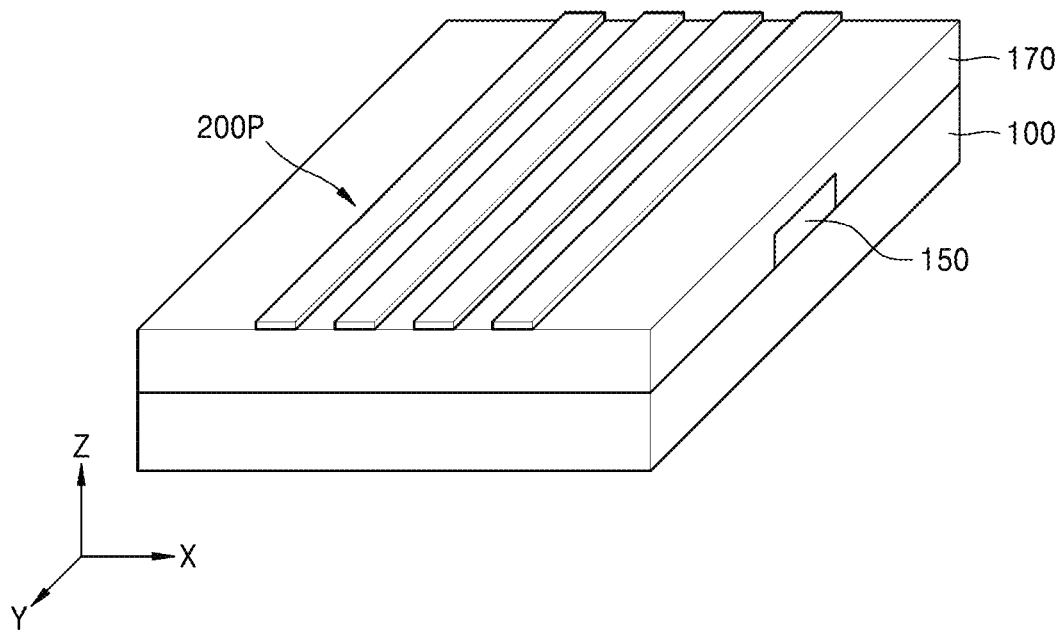

Referring to FIG. 17B, a graphene nanopattern 2000P may be formed on the gate insulation layer (underlayer) 170. A method of forming the graphene nanopattern 200P may be the same as or similar to the method of forming the graphene nanopatterns 200P of FIG. 1E.

Figure 17C:
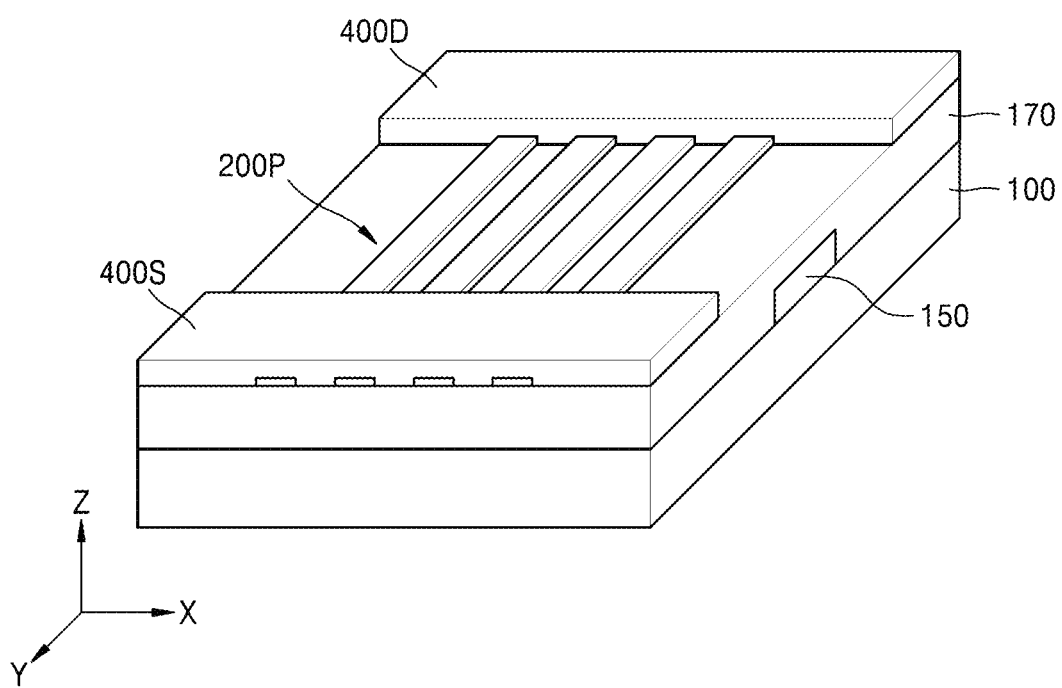

Referring to FIG. 17C, a source electrode 400S and a drain electrode 400D respectively contacting (connected to) both ends of the graphene nanopattern 200P may be formed. This may be substantially the same as the description above with reference to FIG. 15B.

In some cases, a transistor having a double-gate structure including both a bottom-gate and a top-gate may be manufactured. A transistor including a plurality of graphene nanopatterns 200P may also be manufactured. A plurality of devices (graphene-containing devices) may be manufactured on a wafer-scale substrate by using the large-area process described above with reference to FIGS. 11-14. These modifications are well known to one of ordinary skill in the art to which example embodiments pertain, and thus a detailed description thereof will be omitted here.

Graphene nanopattern forming methods according to example embodiments may be applied to various devices (semiconductor devices and electronic devices). For example, graphene nanopattern forming methods according to example embodiments may be applied to various devices such as transistors, tunneling devices, memory devices, solar cells, photodetectors, sensors, and light-emitting devices. The transistors may be a field effect transistor (FET), a binary junction transistor (BJT), a barrier transistor (e.g., a barristor), and the like. The tunneling devices may be a tunneling transistor and other tunneling devices. The sensors may be, for example, a light sensor, a gas sensor, and a sensor that uses a graphene array. The graphene nanopattern may be applicable to, for example, stackable devices, flexible devices, and transparent devices. Since a graphene nanopattern according to example embodiments is flexible and transparent, the graphene nanopattern may be usefully/favorably applied to flexible devices and transparent devices. A device including the graphene nanopatterns may be applied to, for example, various integrated circuits and radio frequency (RF) circuits/devices.

Figure 18:
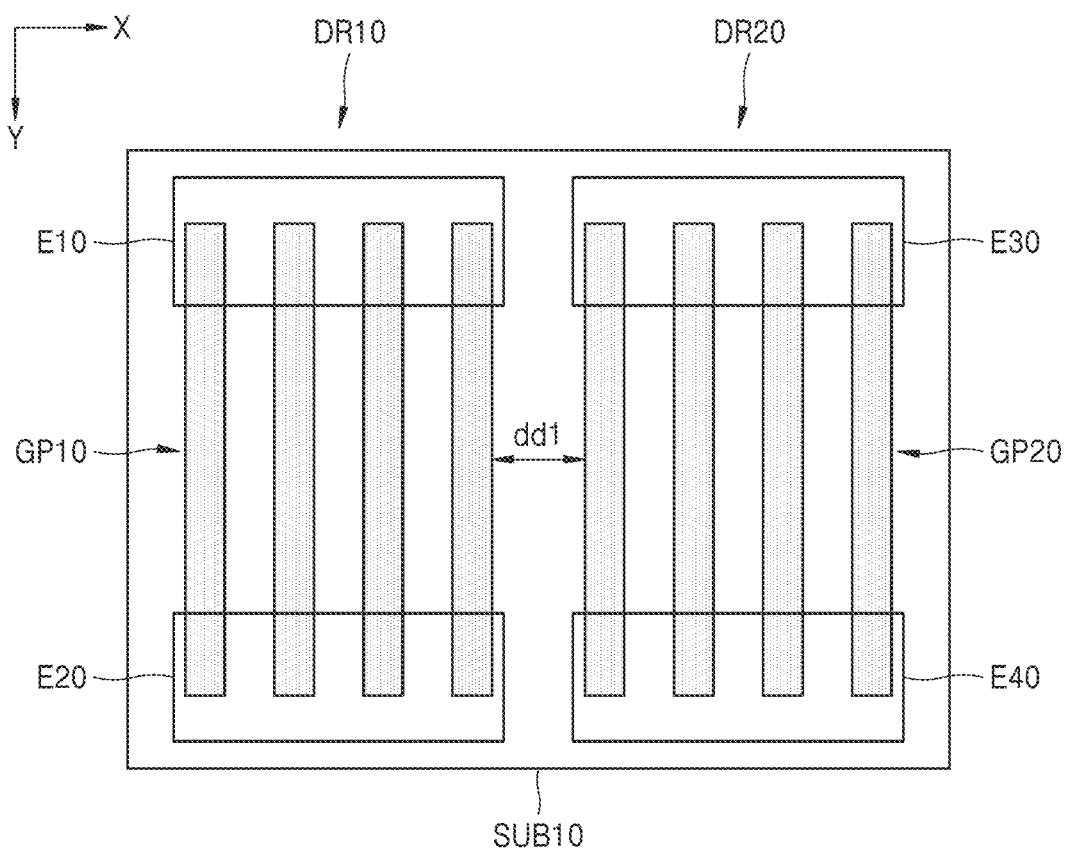
FIG. 18 is a plan view for explaining a graphene-containing device according to example embodiments.

FIG. 18 is a plan view for explaining a graphene-containing device according to example embodiments. In example embodiments, the graphene-containing device may be manufactured using the above-described methods of manufacturing a graphene nanopattern.

Referring to FIG. 18, a first device region DR10 including a first graphene nanopattern GP10 may be disposed in a first region of a substrate SUB10, and a second device region DR20 including a second graphene nanopattern GP20 may be disposed in a second region of the substrate SUB10. The first device region DR10 may further include a first electrode E10 and a second electrode E20 respectively contacting both ends of the first graphene nanopattern GP10. Similarly, the second device region DR20 may further include a third electrode E30 and a fourth electrode E40 respectively contacting both ends of the second graphene nanopattern GP20. The first graphene nanopattern GP10 may have a GNR structure, similar to the graphene nanopattern 200P of FIG. 1E, and the second graphene nanopattern GP20 may also have a GNR structure. A unit pattern of each of the first and second graphene nanopatterns GP10 and GP20 may have a width of about 15 nm or less or about 10 nm or less. The width of the unit pattern may be about 7 nm or less or about 5 nm or less.

A dead zone distance dd1 between the first graphene nanopattern GP10 and the second graphene nanopattern GP20 may be about 20 nm or less or about 15 nm or less. The dead zone distance dd1 may be about 10 nm or less. In some cases, the dead zone distance dd1 may have a size that is similar to a distance between two adjacent unit patterns of the graphene nanopattern GP10 or GP20. According to example embodiments, since a plurality of graphene nanopatterns GP10 and GP20 having high-density fine patterns may be formed without using a topological guide pattern, the dead zone distance dd1 may be greatly reduced. Thus, high-integrated/high-density devices may be easily manufactured. In particular, when a guide pattern is formed of a negative type photoresist material, it is difficult to reduce the width of the guide pattern, and consequently the width of a dead zone may not be easily reduced. However, according to example embodiments, the graphene nanopatterns GP10 and GP20 may be formed without using a guide pattern, and thus a device having a very small dead zone distance dd1 may be implemented.

At least one of the first and second device regions DR10 and DR20 may include one of a transistor, a tunneling device, a memory device, a solar cell, a photodetector, a sensor, and a light-emitting device. The transistors may be a FET, a BJT, a barrier transistor (e.g., a barristor), and the like. When the first and second device regions DR10 and DR20 include a transistor, each of the device regions DR10 and DR20 may have a structure of, for example, FIG. 15C, FIG. 16B, or FIG. 17C. In this case, the first and second electrodes E10 and E20 may be used as a source electrode and a drain electrode, respectively, and, similarly, the third and fourth electrode E30 and E40 may be used as a source electrode and a drain electrode, respectively. The first and second graphene patterns GP10 and GP20 may be used as channel layers.

According to example embodiments, electrodes E10 and E20 of the first device region DR10 may not overlap with electrodes E30 and E40 of the second device region DR20 in the X-axis direction. In this regard, example embodiments are illustrated in FIGS. 19 and 20.

Figure 19:
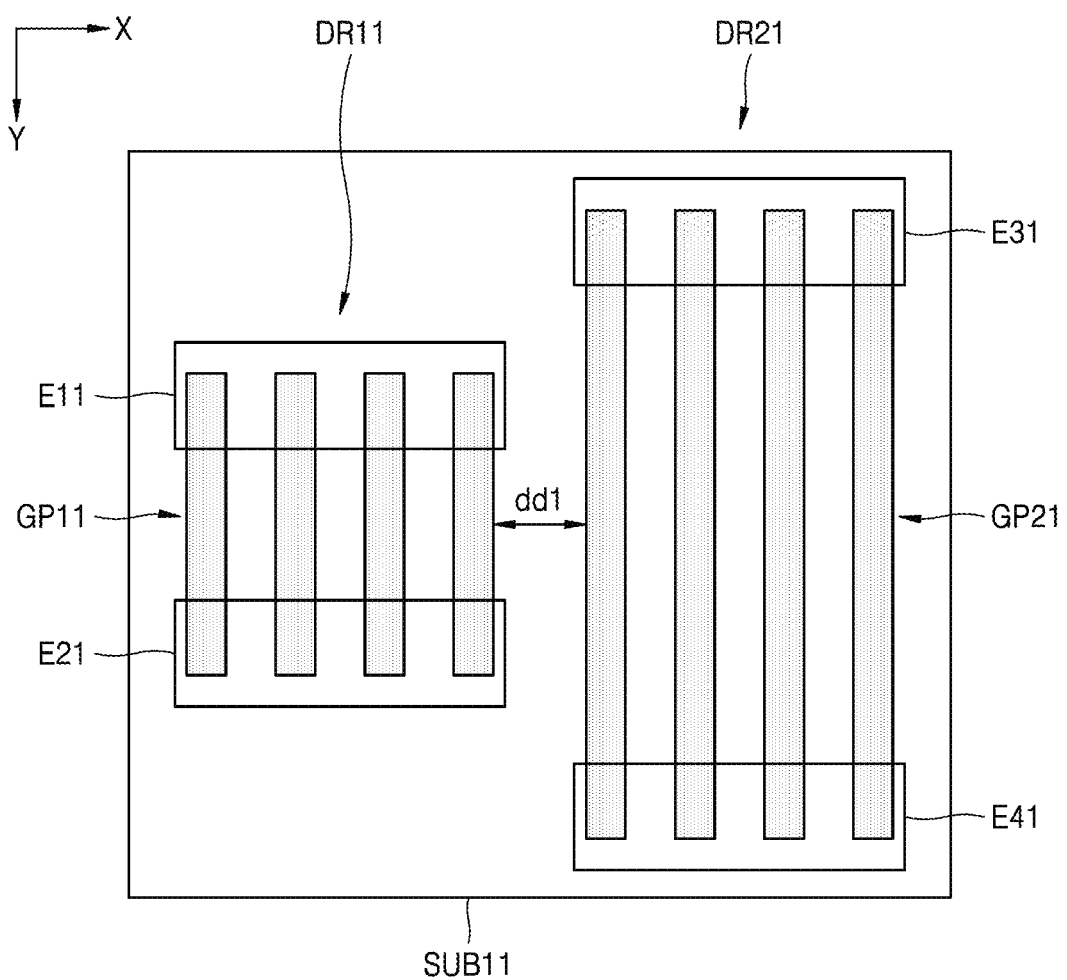
FIG. 19 is a plan view for explaining a graphene-containing device according to example embodiments.

Referring to FIG. 19, first and second electrodes E11 and E21 of a first device region DR11 may be arranged to not overlap with third and fourth electrode E31 and E41 of a second device region DR21 in the X-axis direction. In example embodiments, the first graphene nanopattern GP11 may have a smaller length than the second graphene nanopattern GP21, in the Y-axis direction. The second graphene nanopattern GP21 may have a length that extends from both sides of the first graphene nanopattern GP11 in the Y-axis direction. Thus, the third and fourth electrodes E31 and E41 formed on both ends of the second graphene nanopattern GP21 may not overlap with the first and second electrodes E11 and E21 formed on both ends of the first graphene nanopattern GP11. In FIG. 19, reference numeral SUB11 indicates a substrate.

Figure 20:
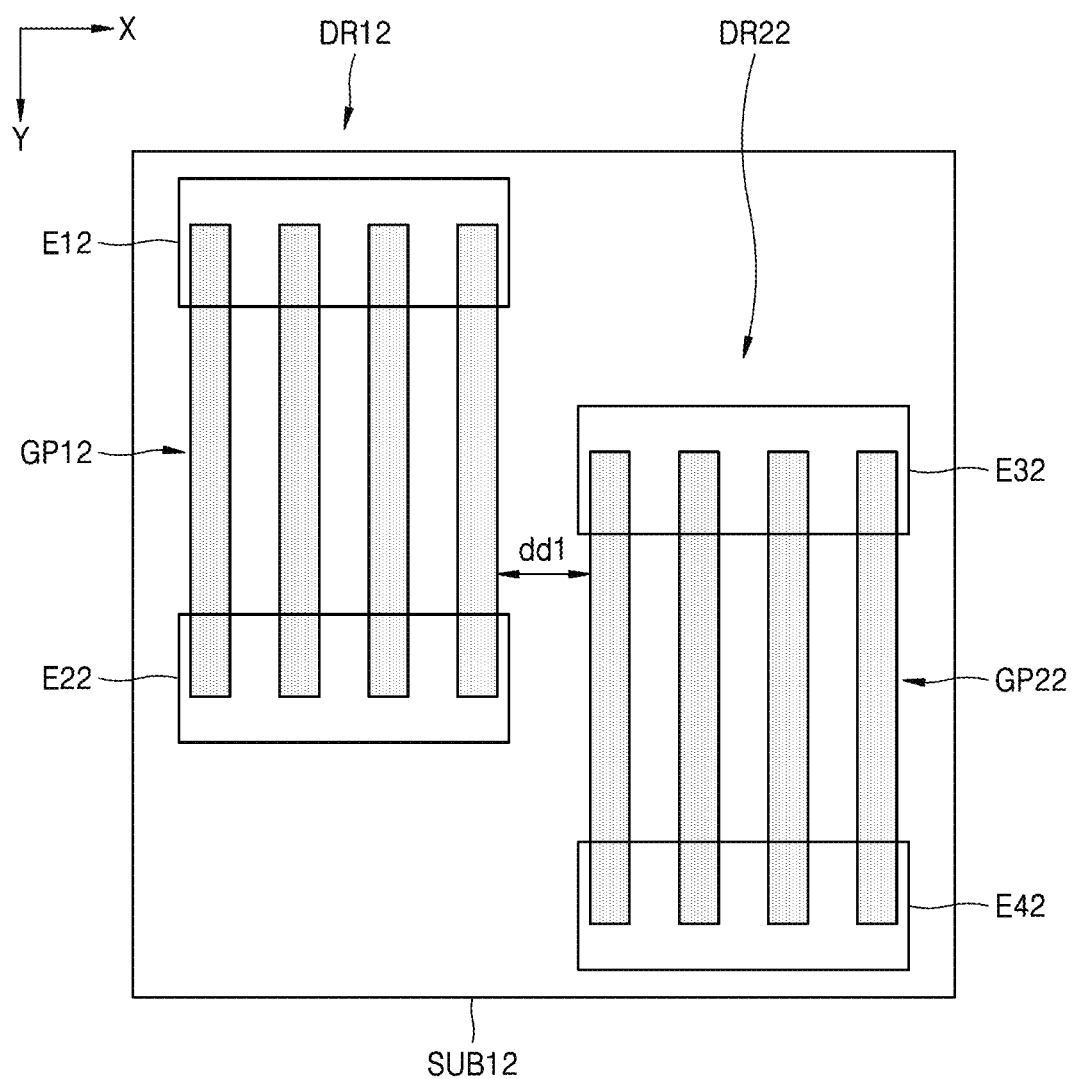
FIG. 20 is a plan view for explaining a graphene-containing device according to example embodiments.

In FIG. 20, a first graphene nanopattern GP12 and a second graphene nanopattern GP22 may have the same length or similar lengths (length in the Y-axis direction). In this case, the second graphene nanopattern GP22 may be shifted from the first graphene nanopattern GP12 to some extent in the Y-axis direction. One end of the second graphene nanopattern GP22 may be at a location corresponding to a region (for example, a center portion) between both ends of the first graphene nanopattern GP12. Thus, third and fourth electrodes E32 and E42 of a second device region DR22 may not overlap with first and second electrodes E12 and E22 of a first device region DR12. In FIG. 20, reference numerals DR12 and DR22 respectively indicate a first device region and a second device region, and reference numeral SUB12 indicates a substrate.

When the electrodes E11, E12, E21, and E22 of the first device regions DR11 and DR12 are disposed not to overlap with the electrodes E31, E32, E41, and E42 of the second device regions DR21 and DR22 as shown in FIGS. 19 and 20, the electrodes E11, E12, E21, E22, E31, E32, E41, and E42 may be more easily formed.

However, the dead zone distance dd1 of FIGS. 18-20 may be about 10 nm or more or about 20 nm or more, and various modifications may be made to the shapes of the first and second graphene nanopatterns GP10 to GP12 and GP20 to GP22 and the structures of the devices included in the first and second device regions DR10 to DR12 and DR20 to DR22.

As described above, according to example embodiments, without using topological guide patterns, a graphene nanopattern having a width of about 10 nm or less or about 5 nm or less may be easily formed using a directed self-assembly (DSA) method assisted by the edge portion of the graphene layer. Thus, various problems/limitations due to use of the guide pattern may be fundamentally limited (and/or prevented). For example, compared with the case of using a guide pattern, a process may be more simplified, dead zones may be greatly reduced, and a multi-layered device and various devices may be easily manufactured. In addition, by adjusting the size/shape of an initial graphene layer and the molecular amounts of the polymers used in a block copolymer layer, a graphene nanopattern having a desired size and a desired shape may be easily formed. Moreover, example embodiments may be suitable for a large-area/commercialization process. By using example embodiments, high-performance graphene-containing devices including high-density graphene nanopatterns may be easily implemented.

FIGS. 21A-21D are perspective views for explaining a method of forming a nanopattern, according to example embodiments.

Referring to FIGS. 21A-21D, a nanopattern may be formed using a method that is the same as the method described in FIGS. 1A to 1E, except for a different type of two-dimensional material layer may be patterned instead of a graphene layer.

Figure 21A:
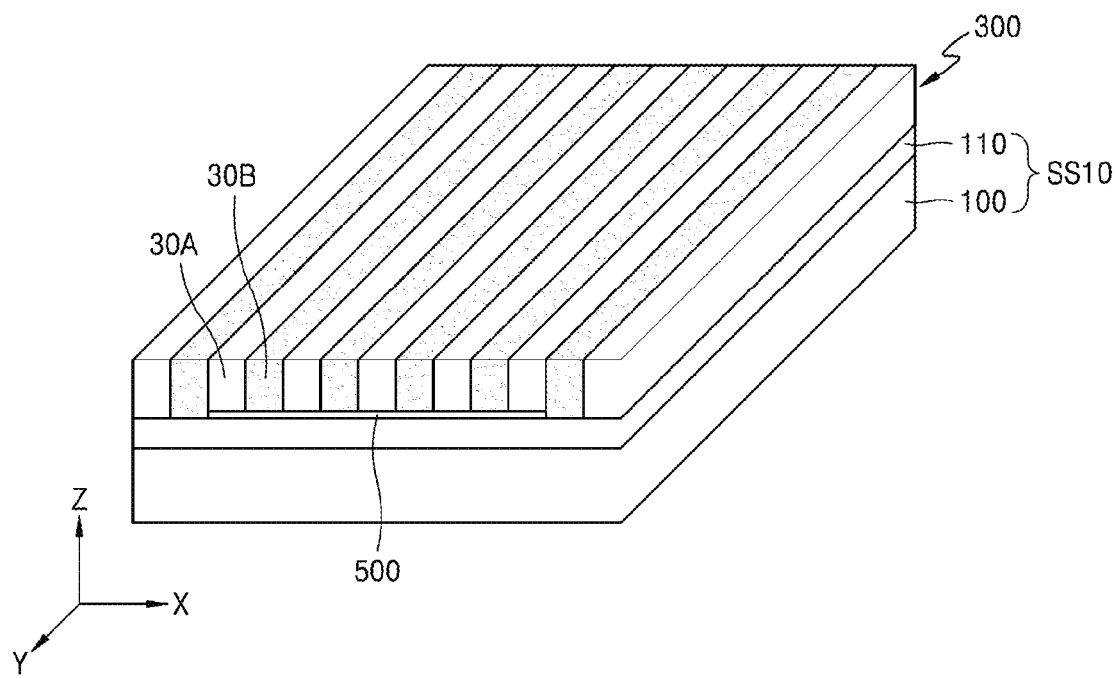
FIGS. 21A-21D are perspective views for explaining a method of forming a nanopattern, according to example embodiments.

For example, instead of the graphene layer 200 in FIGS. 1A and 1B, FIG. 21A shows a non-graphene two-dimensional material layer 500 may be provided on the substrate structure SS10. The two-dimensional layer 500 may include a transition metal chalcogenide (TMDC) including a metal atom (e.g., one of Mo, W, Nb, V, Ta, Ti, Zr, Hf, Tc, Re, Cu, Ga, In, Sn, Ge, and Pb) and a chalcogen atom (e.g., one S, Se, and Te). The two-dimensional layer 500 layer may include one of $MoS_2$, $MoSe_2$, $MoTe_2$, $WSe_2$, $WTe_2$, $WS_2$, $ZrS_2$, $ZrSe_2$, $HfS_2$, $HfSe_2$, and $NbSe_2$, $WS_2$, and $MoS_2$. Alternatively, the two-dimensional material layer 500 may include hexagonal boron nitride (h-BN). The block copolymer layer 300 may be formed directly on the two-dimensional material layer 500.

Figure 21B:
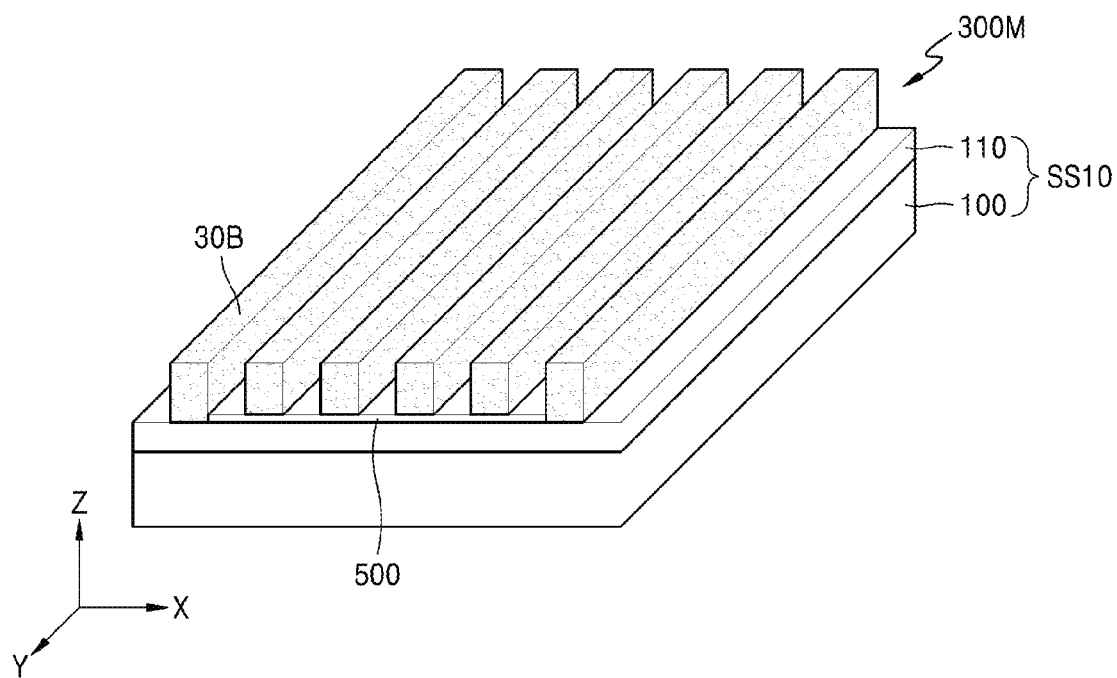
Figure 21C:
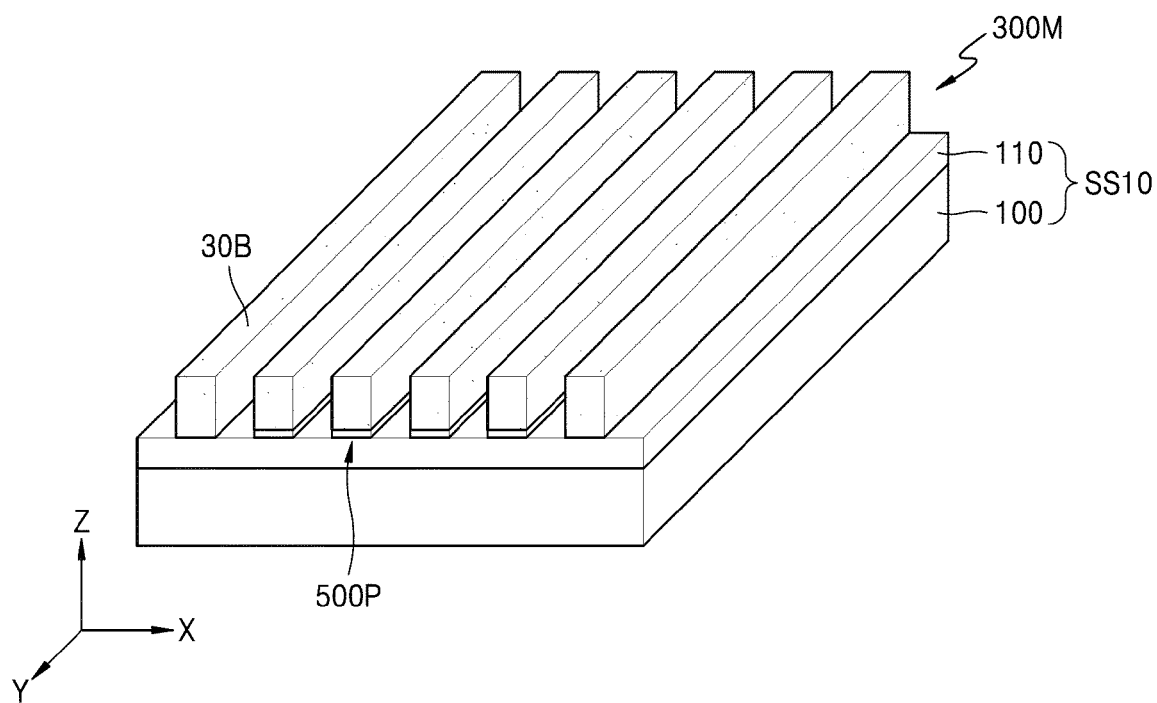
Figure 21D:
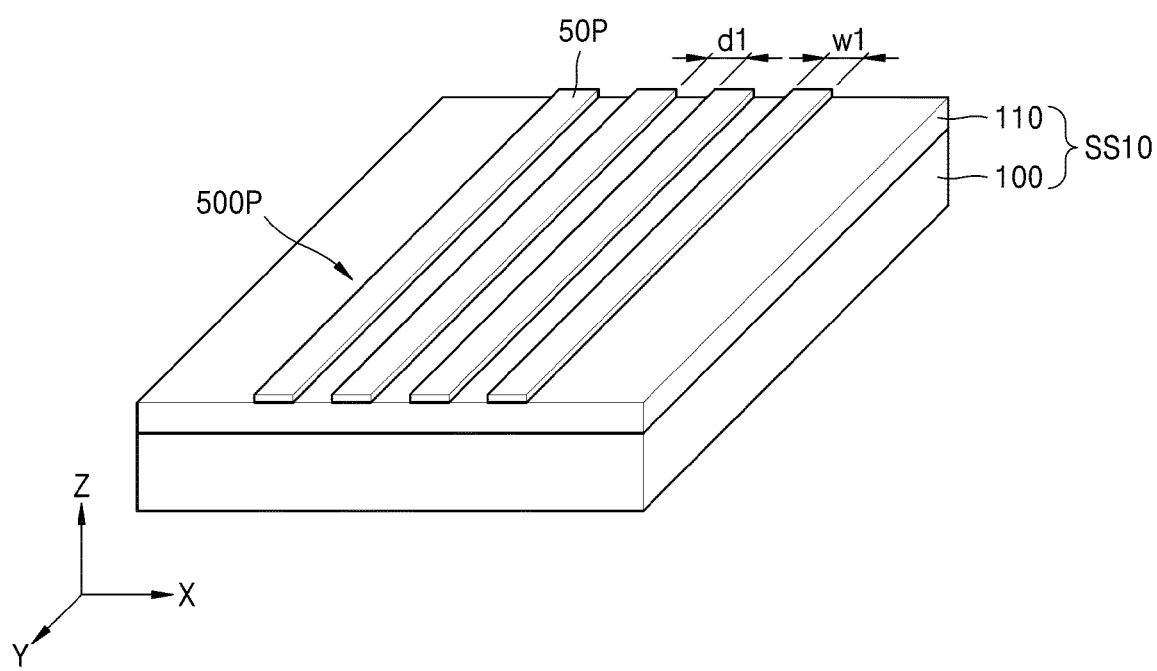

Referring to FIG. 21B, the mask pattern 300M may be formed by removing the plurality of first regions 30A. As shown in FIG. 21C, the two-dimensional material layer 500 may be patterned using the mask pattern 300M as an etching mask. As a result, a two-dimensional material layer nanopattern 500P including unit patterns 50P may be formed. Referring to FIG. 21D, the mask pattern 300M may be removed.

While example embodiments have been particularly shown and described, it should be understood that the example embodiments should be considered in a descriptive sense only and not for purposes of limitation. For example, it will be understood by one of ordinary skill in the art that various changes in form and details may be made in the methods of forming a graphene nanopattern described above with reference to FIGS. 1A-14 and/or forming a nanopattern as described in FIGS. 21A-21D without departing from the spirit and scope of the following claims. It will also be understood by one of ordinary skill in the art that various changes in form and details may be made in the methods of manufacturing a graphene-containing device described above with reference to FIGS. 15A-17C and FIGS. 18-20 and in the structures/types of the graphene-containing devices manufacturing according to the methods.

What is claimed is:

1. A method of forming a graphene nanopattern, the method comprising:
providing a graphene layer on a substrate, the graphene layer having a smaller width than the substrate;
forming a block copolymer layer on the graphene layer and a region of the substrate exposed on at least one side of the graphene layer,
the block copolymer layer including a plurality of first regions and a plurality of second regions arranged parallel to the graphene layer, and
one of the plurality of first regions being arranged along an edge portion of the graphene layer;
forming a mask pattern from the block copolymer layer by removing one of the plurality of first regions and the plurality of second regions of the block copolymer layer; and
patterning the graphene layer in a nanoscale by using the mask pattern as an etching mask.

2. The method of claim 1, wherein the forming the block copolymer layer includes forming the block copolymer layer to directly contact the graphene layer.

3. The method of claim 1, wherein the forming the block copolymer layer includes forming the block copolymer layer to directly contact the region of the substrate that is exposed on the at least one side of the graphene layer.

4. The method of claim 1, wherein the forming the block copolymer layer includes using a directed self-assembly (DSA) method assisted by the edge portion of the graphene layer without using a topological guide.

5. The method of claim 1, wherein
the patterning the graphene layer includes forming a plurality of unit patterns, and
at least one of the plurality of unit patterns has a width that is greater than 0 nm and less than or equal to 10 nm.

6. The method of claim 5, wherein the width of the at least one of the plurality of unit patterns is greater than 0 nm and less than or equal to 5 nm.

7. The method of claim 1, wherein the graphene nanopattern includes a graphene nanoribbon (GNR).

8. The method of claim 1, wherein
the edge portion of the graphene layer has a straight line shape, and
the graphene nanopattern includes a straight line pattern.

9. The method of claim 1, wherein
the edge portion of the graphene layer has a curved line shape, and
the graphene nanopattern includes a curved line pattern.

10. The method of claim 1, wherein the graphene layer has a width of several tens of nm to several hundreds of nm.

11. The method of claim 1, wherein
the providing the graphene layer includes forming a plurality of graphene layers on the substrate, and
the forming the block copolymer layer includes forming the block copolymer layer on the plurality of graphene layers.

12. The method of claim 1, wherein the substrate has a wafer scale.

13. The method of claim 1, wherein
the substrate includes an insulation layer on a surface thereof, and
the forming the graphene layer includes forming the graphene layer on the insulation layer.

14. The method of claim 13, wherein the insulation layer includes a hydrophilic material.

15. The method of claim 1, wherein the block copolymer layer includes one of PS-b-PDMS, PS-b-P4VP, PS-b-P2VP, PS-b-PEO, PS-b-PAA, PS-b-PB, PS-b-PI, PI-b-P4VP, PI-b-P2VP, PI-b-PEO, PI-b-PAA, PMMA-b-P4VP, PMMA-b-P2VP, PMMA-b-PEO, PMMA-b-PAA, PS-b-PMA, PS-b-PMMA, PI-b-PMA, PI-b-PMMA, PMMA-b-PMA, PS-b-PS-OH, and PI-b-PS-OH.

16. The method of claim 1, wherein
the forming the block copolymer layer includes,
forming a thin film by coating a surface of the graphene layer and the region of the substrate with a solution including a block copolymer, and inducing a self-assembly of the block copolymer in the thin film by annealing the thin film.

17. A method of forming a graphene nanopattern, the method comprising:
providing a graphene layer on an underlayer;
forming a block copolymer layer directly on the graphene layer, the block copolymer layer including a plurality of first regions and a plurality of second regions alternately arranged in a direction parallel to the graphene layer, and one of the plurality of first regions being arranged along an edge portion of the graphene layer;
forming a mask pattern by removing one of the plurality of first regions and the plurality of second regions of the block copolymer layer; and
patterning the graphene layer in a nanoscale by using the mask pattern as an etching mask.

18. The method of claim 17, wherein the forming the block copolymer layer includes forming the block copolymer layer to directly contact a region of the underlayer that is exposed on at least one side of the graphene layer.

19. The method of claim 17, wherein the forming the block copolymer layer includes using a directed self-assembly (DSA) method assisted by the edge portion of the graphene layer without using a topological guide.

20. A method of manufacturing a graphene-containing device, the method comprising:
forming a graphene nanopattern using the method of claim 1; and
forming a device unit including the graphene nanopattern.

21. The method of claim 20, wherein the graphene-containing device includes one of a field effect transistor (FET), a tunneling device, a binary junction transistor (BJT), a barristor, a memory device, a solar cell, a photodetector, a sensor, and a light-emitting device.

22. The method of claim 20, wherein
the graphene-containing device is a transistor, and
the graphene nanopattern is a channel layer of the transistor.

23. A method of forming a graphene nanopattern, the method comprising:
forming a block copolymer layer on a stack structure, the stack structure including a graphene layer on a substrate,
the graphene layer having a width that is smaller than a width of the substrate such that the graphene layer exposes a region of the substrate along at least one side of the graphene layer,
the block copolymer layer including a plurality of first regions and a plurality of second regions alternately arranged on the graphene layer and the substrate,
one of the plurality of first regions being arranged along an edge portion of the graphene layer;
forming a mask pattern by removing one of the plurality of first regions and the plurality of second regions of the block copolymer layer; and
patterning the graphene layer in a nanoscale by using the mask pattern as an etching mask.

24. The method of claim 23, wherein
the block copolymer includes a first polymer and a second polymer,
the first polymer and the second polymer are different materials compared to each other,
the first polymer is hydrophobic compared to the second polymer,
the second eepolymer is hydrophilic compared to the first polymer,
the plurality of first regions are formed from the first polymer, and
the plurality of second regions are formed from the second polymer.

25. The method of claim 24, wherein the block copolymer layer includes one of PS-b-PDMS, PS-b-P4VP, PS-b-P2VP, PS-b-PEO, PS-b-PAA, PS-b-PB, PS-b-PI, PI-b-P4VP, PI-b-P2VP, PI-b-PEO, PI-b-PAA, PMMA-b-P4VP, PMMA-b-P2VP, PMMA-b-PEO, PMMA-b-PAA, PS-b-PMA, PS-b-PMMA, PI-b-PMA, PI-b-PMMA, PMMA-b-PMA, PS-b-PS-OH, and PI-b-PS-OH.

26. The method of claim 24, wherein
the forming the block copolymer on the stack structure includes forming the block copolymer directly on the graphene layer,
the patterning the graphene layer includes forming a plurality of unit patterns, and
at least one of the plurality of unit patterns has a width that is greater than 0 nm and less than or equal to 10 nm.

27. The method of claim 23, wherein the forming the block copolymer layer includes using a directed self-assembly (DSA) method assisted by the edge portion of the graphene layer without using a topological guide.

* * * * *